(12) United States Patent
Cho et al.

(10) Patent No.: US 11,784,137 B2
(45) Date of Patent: Oct. 10, 2023

(54) SEMICONDUCTOR DEVICE AND METHOD FOR FABRICATING THE SAME

(71) Applicant: Samsung Electronics Co., Ltd., Suwon-si (KR)

(72) Inventors: Yun Rae Cho, Guri-si (KR); Ae Nee Jang, Seoul (KR); Seung Hun Han, Hwaseong-si (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 17/151,787

(22) Filed: Jan. 19, 2021

(65) Prior Publication Data
US 2021/0143109 A1    May 13, 2021

Related U.S. Application Data

(63) Continuation of application No. 16/512,469, filed on Jul. 16, 2019, now Pat. No. 10,930,602.

(30) Foreign Application Priority Data

Oct. 19, 2018   (KR) ........................ 10-2018-0124978

(51) Int. Cl.
*H01L 23/00*   (2006.01)
*H01L 23/31*   (2006.01)
(Continued)

(52) U.S. Cl.
CPC ............ *H01L 23/562* (2013.01); *H01L 21/78* (2013.01); *H01L 23/3114* (2013.01); *H01L 23/53295* (2013.01); *H01L 21/561* (2013.01)

(58) Field of Classification Search
CPC ... H01L 21/561; H01L 21/78; H01L 23/3114; H01L 23/3178; H01L 23/53295; H01L 23/562
See application file for complete search history.

(56) References Cited

U.S. PATENT DOCUMENTS

| 7,387,950 B1 | 6/2008 | Kuo et al. |
| 8,536,694 B2 | 9/2013 | Inomata |

(Continued)

FOREIGN PATENT DOCUMENTS

| JP | 2005294677 A | 10/2005 |
| JP | 2007115988 A | 5/2007 |

(Continued)

*Primary Examiner* — Hung K Vu
(74) *Attorney, Agent, or Firm* — Myers Bigel, P. A.

(57) ABSTRACT

A semiconductor device in which reliability and production yield are improved by reducing or preventing the spreading of cracks that may occur in the die sawing process, and a method for fabricating the same are provided. The semiconductor device includes a substrate which includes a first chip region and a scribe lane region surrounding the first chip region, a first low-k insulating film, which includes a first insulating material having a dielectric constant lower than silicon oxide, on the substrate in the first chip region, a wiring structure, which includes a second low-k insulating film including the first insulating material and a first wiring pattern in the second low-k insulating film, on the substrate in the scribe lane region, and a first protective insulating film, which includes a second insulating material different from the first insulating material, between the first low-k insulating film and the wiring structure.

15 Claims, 31 Drawing Sheets

(51) Int. Cl.
*H01L 23/532* (2006.01)
*H01L 21/78* (2006.01)
*H01L 21/56* (2006.01)

(56) References Cited

U.S. PATENT DOCUMENTS

| | | | |
|---|---|---|---|
| 8,952,519 B2 | 2/2015 | Lin et al. | |
| 9,196,571 B2 | 11/2015 | Lin et al. | |
| 9,406,625 B2 | 8/2016 | Wang et al. | |
| 9,589,911 B1* | 3/2017 | Liang | H01L 23/522 |
| 9,704,823 B2 | 7/2017 | Kamphuis et al. | |
| 9,847,301 B2* | 12/2017 | Minami | G01R 31/2856 |
| 2004/0004234 A1* | 1/2004 | Yagishita | H01L 29/66545 |
| | | | 257/E21.507 |
| 2011/0169159 A1 | 7/2011 | Lin et al. | |
| 2013/0043470 A1* | 2/2013 | Huang | H01L 23/585 |
| | | | 257/E21.546 |
| 2013/0062727 A1 | 3/2013 | Huang et al. | |
| 2015/0123285 A1 | 5/2015 | Lin et al. | |
| 2017/0062399 A1 | 3/2017 | England et al. | |
| 2020/0058543 A1* | 2/2020 | Han | H01L 21/6836 |
| 2021/0327839 A1* | 10/2021 | Han | H01L 24/09 |

FOREIGN PATENT DOCUMENTS

| | | |
|---|---|---|
| JP | 2008130880 A | 6/2008 |
| JP | 2010074106 A | 4/2010 |
| JP | 5235829 B2 | 7/2013 |
| JP | 5532870 B2 | 5/2014 |
| KR | 20060051136 A | 5/2006 |
| KR | 20110025526 A | 3/2011 |
| KR | 20160052484 A | 5/2016 |

\* cited by examiner

SEMICONDUCTOR DEVICE AND METHOD FOR FABRICATING THE SAME

CROSS-REFERENCE TO RELATED APPLICATION

This application is a continuation of and claims priority to U.S. patent application Ser. No. 16/512,469, filed on Jul. 16, 2019, which claims priority to Korean Patent Application No. 10-2018-0124978, filed on Oct. 19, 2018, and all the benefits accruing therefrom under 35 U.S.C. § 119, the disclosures of which are incorporated herein by reference in their entireties.

FIELD

The present inventive concepts relate to semiconductor devices and methods for fabricating the same. More specifically, the present inventive concepts relate to semiconductor devices including a protective insulating film in a scribe lane region, and methods for fabricating the same.

BACKGROUND

A semiconductor chip may be formed through a die sawing process for cutting a semiconductor wafer on which an integrated circuit element is formed. During the die sawing process, a sawing blade may cut the semiconductor wafer along the scribe lane region, and as a result, a plurality of semiconductor chips may be physically separated.

As integrated circuit elements are required to have larger capacity and higher integration, an area occupied by the scribe lane region in the semiconductor wafer may decrease. Thus, there may be increased risk of damage to the integrated circuit elements, for example, due to stress applied to the semiconductor chip during the die sawing process.

SUMMARY

Aspects of the present inventive concepts provide semiconductor devices in which reliability and/or productivity/production yield may be improved by reducing or blocking the spreading of cracks that may occur in the die sawing process.

Aspects of the present inventive concepts also provide methods for fabricating semiconductor devices in which reliability and/or productivity/production yield of the semiconductor devices may be improved by reducing or blocking the spreading of cracks that may occur in the die sawing process.

Technical problems addressed by the present inventive concepts are not limited to the technical problems mentioned above and other technical problems that may be addressed by the present inventive concepts but are not specifically mentioned may be clearly understood by those skilled in the art from the description below.

According to aspects of the present inventive concepts, there is provided a semiconductor device comprising a substrate which includes a first chip region and a scribe lane region surrounding the first chip region, a first low-k insulating film, which includes a first insulating material having a dielectric constant lower than silicon oxide, on the substrate in the first chip region, a wiring structure, which includes a second low-k insulating film including the first insulating material and a first wiring pattern in the second low-k insulating film, on the substrate in the scribe lane region, and a first protective insulating film, which includes a second insulating material different from the first insulating material, between the first low-k insulating film and the wiring structure.

According to aspects of the present inventive concepts, there is provided a semiconductor device comprising a substrate including a first chip region, a second chip region, and a scribe lane region between the first chip region and the second chip region, a first low-k insulating film, which includes a first insulating material having a dielectric constant lower than silicon oxide, on the substrate in the first chip region, a second low-k insulating film including the first insulating material on the substrate in the second chip region, a third low-k insulating film including the first insulating material on the substrate in the scribe lane region, a first protective insulating film including a second insulating material different from the first insulating material between the first low-k insulating film and the third low-k insulating film, and a second protective insulating film including the second insulating material between the second low-k insulating film and the third low-k insulating film.

According to aspects of the present inventive concepts, there is provided a semiconductor device comprising a substrate which includes a chip region and a scribe lane region surrounding the chip region, the scribe lane region including an item region and a protective region between the chip region and the item region, a first interlayer insulating film including silicon oxide, on the substrate, a low-k insulating film, which includes a trench in the protective region and includes a low-k material having a dielectric constant lower than silicon oxide, on the first interlayer insulating film, a wiring pattern formed in the low-k insulating film on the item region, and a protective insulating film which fills the trench and includes silicon oxide.

According to aspects of the present inventive concepts, there is provided a method for fabricating a semiconductor device, the method comprising providing a substrate which includes a chip region and a scribe lane region surrounding the chip region, the scribe lane region including an item region, and a protective region between the chip region and the item region, forming a first interlayer insulating film and a low-k insulating film on the substrate, the low-k insulating film including a first insulating material having a dielectric constant lower than silicon oxide on the first interlayer insulating film, forming a trench in the low-k insulating film on the protective region, the trench exposing a top surface of the first interlayer insulating film, and forming a protective insulating film in the trench, the protective insulating film including a second insulating material different from the first insulating material.

BRIEF DESCRIPTION OF THE DRAWINGS

The above and other aspects and features of the present inventive concepts will become more apparent by describing in detail exemplary embodiments thereof with reference to the attached drawings, in which.

DETAILED DESCRIPTION OF THE EMBODIMENTS

Hereinafter, a semiconductor device according to some embodiments of the present inventive concepts will be described with reference to FIGS. 1 to 21.

Figure 1:
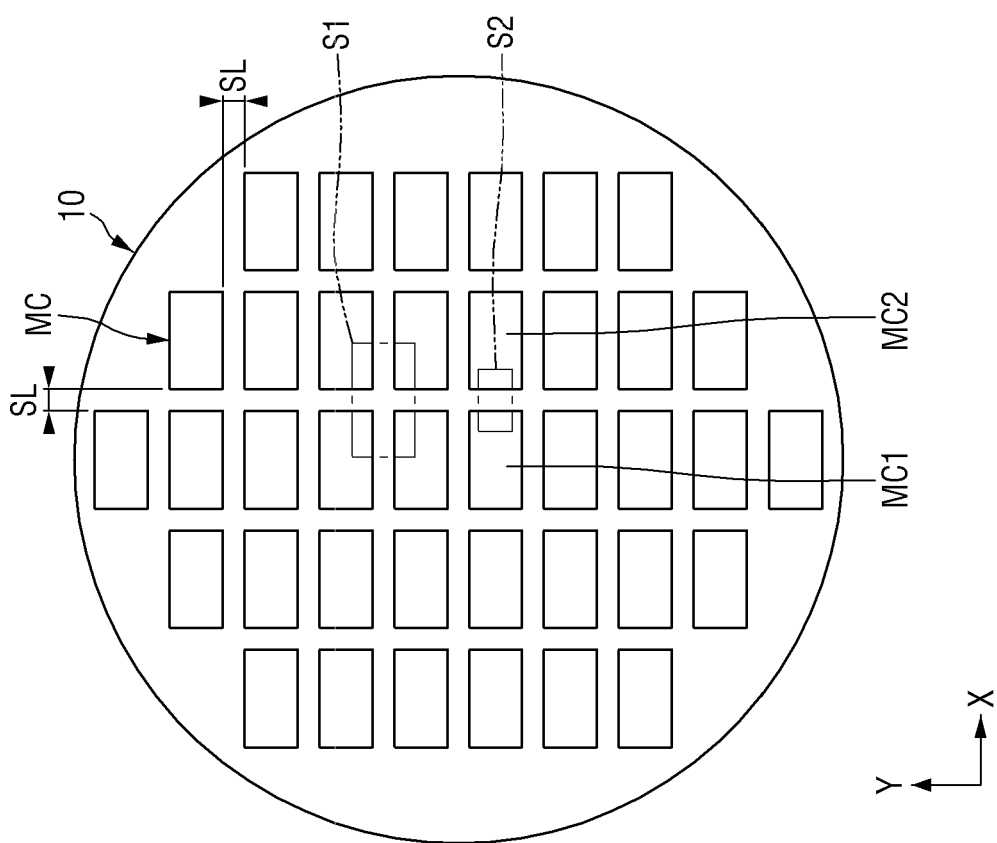
FIG. 1 is a schematic plan view of a semiconductor device according to some embodiments of the present inventive concepts.
Figure 2:
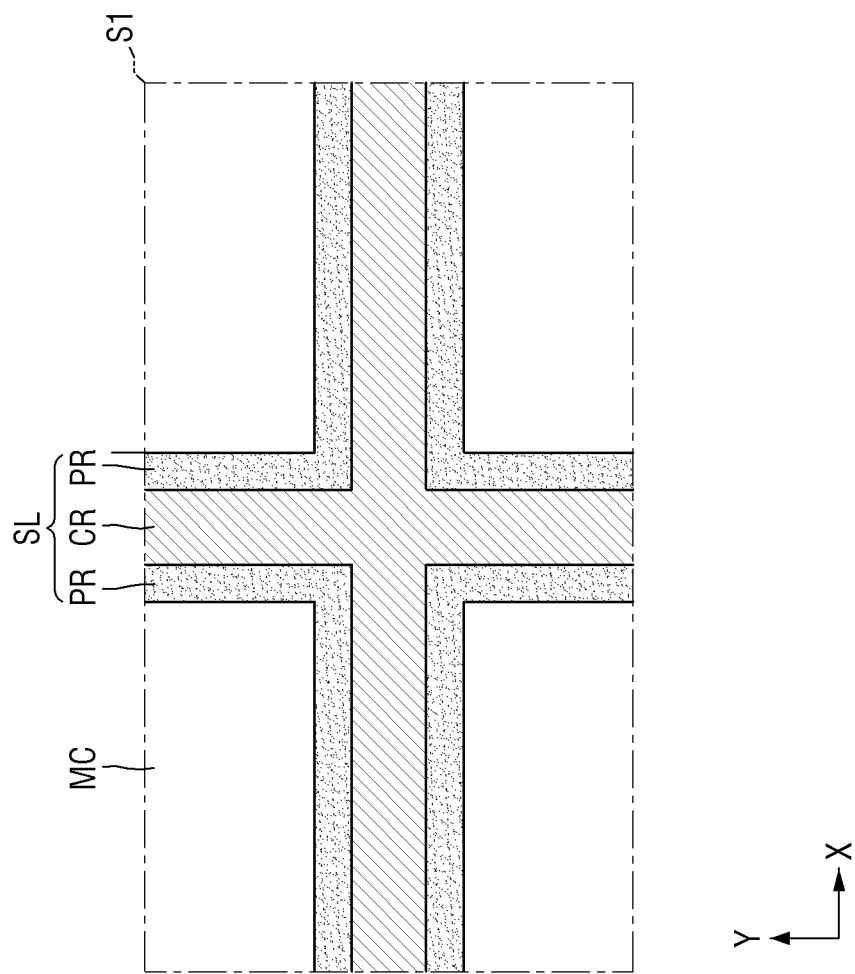
FIG. 2 is a schematic layout diagram illustrating a region S1 of FIG. 1.
Figure 3:
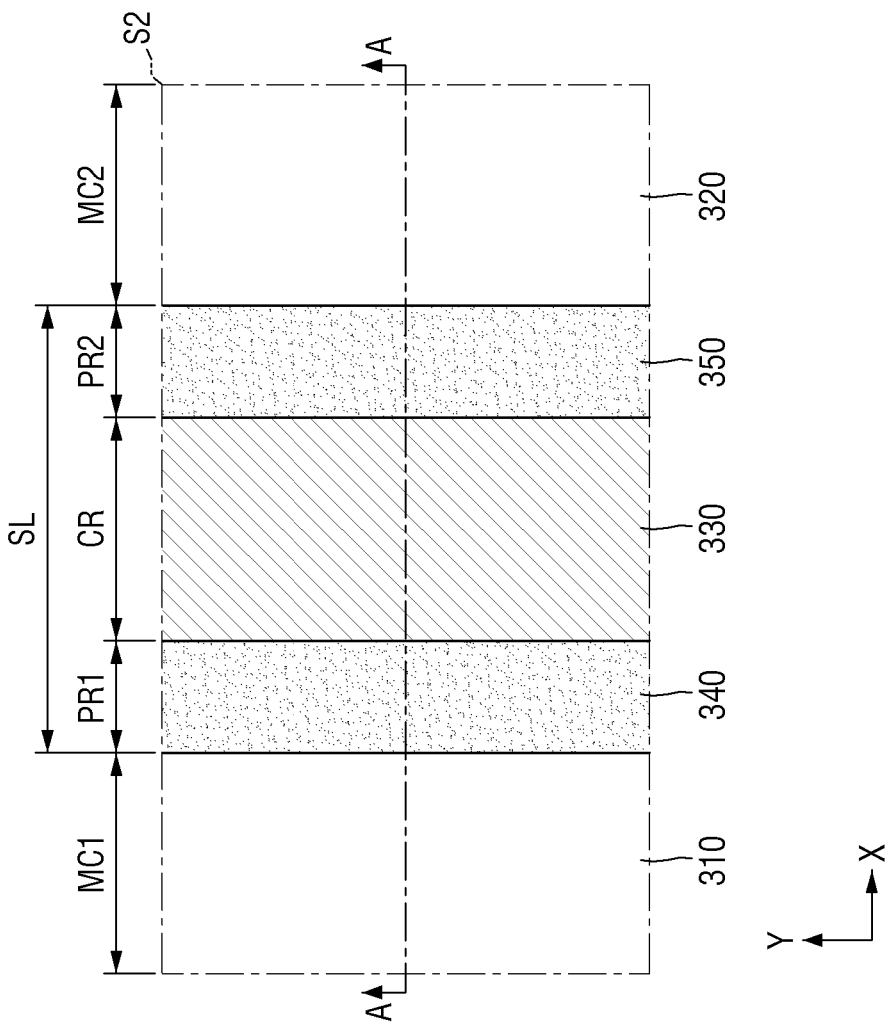
FIG. 3 is a schematic layout diagram illustrating a region S2 of FIG. 1.
Figure 4:
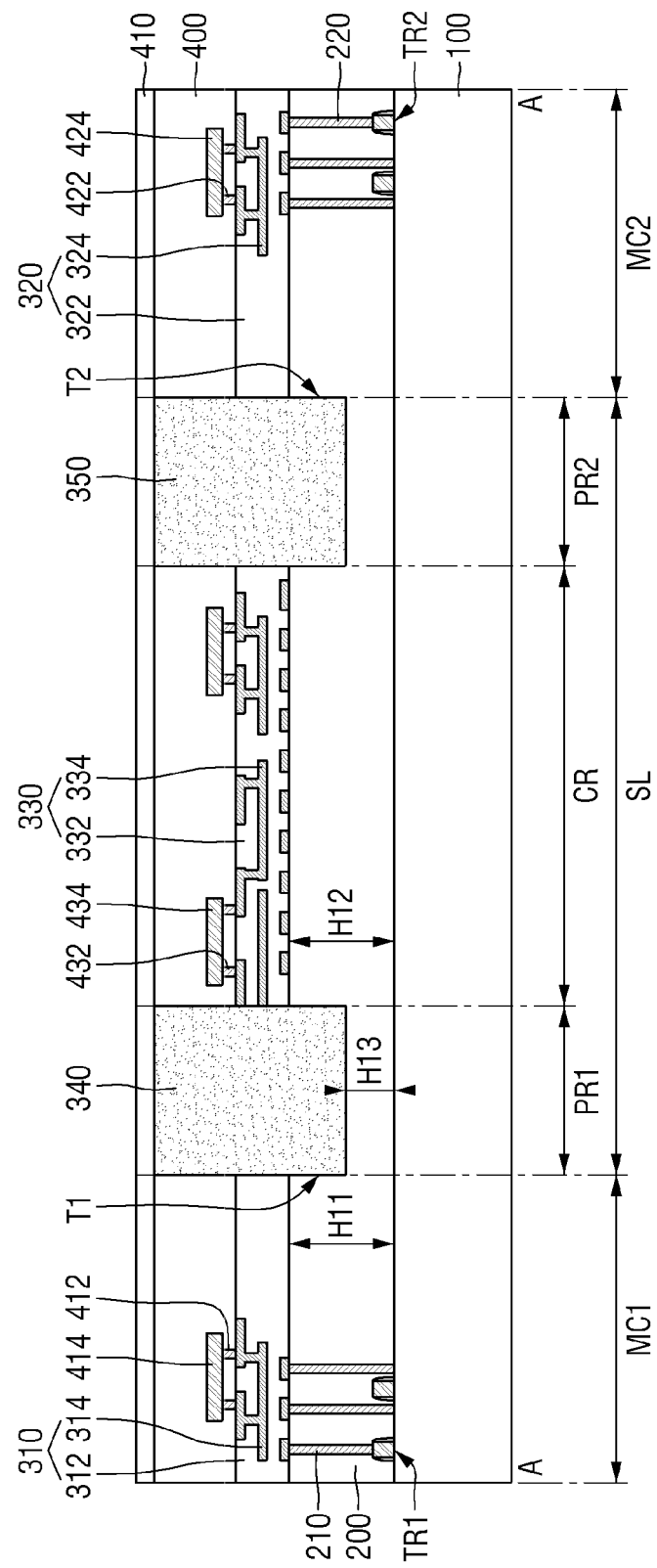
FIG. 4 is a cross-sectional view taken along line A-A of FIG. 3.

FIG. 1 is a schematic plan view of a semiconductor device according to some embodiments of the present inventive concepts. FIG. 2 is a schematic layout diagram illustrating a region S1 of FIG. 1. FIG. 3 is a schematic layout diagram illustrating a region S2 of FIG. 1. FIG. 4 is a cross-sectional view taken along line A-A of FIG. 3.

Referring to FIGS. 1 to 4, a semiconductor device according to some embodiments includes a substrate 100, a first interlayer insulating film 200, first to third wiring structures 310, 320 and 330, a second interlayer insulating film 400, and first and second protective insulating films 340 and 350.

Although terms such as first and second are used to describe various elements or components, but these elements and components are not limited by these terms. These terms are used to distinguish a single element or component from other elements or components. Therefore, a first element or component to be described below may be a second element or component within the present inventive concepts.

The substrate 100 may be bulk silicon or silicon-on-insulator (SOI). Alternatively, the substrate 100 may be a silicon substrate or may include, but is not limited to, other materials, for example, silicon germanium, silicon germanium on insulator (SGOI), indium antimonide, lead tellurium compound, indium arsenide, phosphide indium, gallium arsenide or gallium antimonide. The substrate 100 may, for example, refer to a semiconductor wafer 10.

The substrate 100 may include a plurality of chip regions MC and scribe lane regions SL.

A semiconductor chip may be formed in each chip region MC. For example, a semiconductor element such as a memory element or a logic element may be formed in each chip region MC. Further, the semiconductor element may include various kinds of individual elements. For example, the individual elements may include MOSFETs such as CMOS transistors, image sensors such as a system LSI (large scale integration) and a CIS (CMOS image sensor), a MEMS (microelectromechanical systems), various other active elements and passive elements.

The scribe lane region SL may surround each chip region MC. As used herein, an element or region described as surrounding another element or region may completely surround, partially surround, or extend along a periphery of the other element or region. For example, the scribe lane region SL may be a linear lane form or shape having a substantially constant width. The plurality of chip regions MC may be separated or singulated from one another by a die sawing process performed along the scribe lane region SL.

Each chip region MC may be spaced apart from each other by the scribe lane region SL. For example, as illustrated in FIG. 3, the plurality of chip regions MC may include a first chip region MC1 and a second chip region MC2 which are spaced apart from each other by the scribe lane region SL. For example, the first chip region MC1 and the second chip region MC2 may be arranged along a first direction X, and the scribe lane region SL may extend in a second direction Y intersecting the first direction X between the first chip region MC1 and the second chip region MC2.

The scribe lane region SL may include an item region CR and a protective region PR.

Various item patterns for a semiconductor device according to some embodiments may be formed in the item region CR. For example, item patterns such as a TEG (Test Element Group) module, an alignment key, and an MI (Metrology & Inspection) may be formed in the item region CR, but are not limited thereto.

The protective region PR may be interposed between the item region CR and each chip region MC. In some embodiments, the protective region PR may surround each chip region MC, and the item region CR may surround the protective region PR.

For example, as illustrated in FIG. 3, the protective region PR may include a first protective region PR1 interposed between the item region CR and the first chip region MC1, and a second protective region PR2 interposed between the item region CR and the second chip region MC2.

The first interlayer insulating film 200 may be formed on the substrate 100. In FIG. 4, although the first interlayer insulating film 200 is illustrated as being a single layer, this is only for convenience of explanation, and the present disclosure is not limited thereto. For example, the first interlayer insulating film 200 may be formed by stacking a plurality of insulating films.

In some embodiments, first and second integrated circuit elements TR1 and TR2 may be provided on the substrate 100. The first interlayer insulating film 200 may cover the first and second integrated circuit elements TR1 and TR2. The first and second integrated circuit elements TR1 and TR2 may include, for example, transistors. For example, a gate electrode structure may be formed on one side of the substrate 100, and the impurities are doped into the substrate 100 on both sides of the gate electrode structure to form the first and second integrated circuit elements TR1 and TR2.

The first to third wiring structures 310, 320 and 330 may be formed on the first interlayer insulating film 200. Specifically, the first wiring structure 310 may be formed on the first interlayer insulating film 200 of the first chip region MC1, the second wiring structure 320 may be formed on the first interlayer insulating film 200 of the second chip region MC2, and the third wiring structure 330 may be formed on the first interlayer insulating film 200 of the item region CR.

The first to third wiring structures 310, 320 and 330 may include low-k insulating films 312, 322 and 332, and wiring patterns 314, 324 and 334, respectively. For example, the first wiring structure 310 may include a first low-k insulating film 312 and a first wiring pattern 314, the second wiring structure 320 may include a second low-k insulating film 322 and a second wiring pattern 324, and the third wiring structure 330 may include a third low-k insulating film 332 and a third wiring pattern 334.

The first to third low-k insulating films 312, 322 and 332 may include a first insulating material. In some embodiments, the first insulating material may be a low-k material having a dielectric constant lower than silicon oxide. For example, the first to third low-k insulating films 312, 322, and 332 may include, but are not limited to, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, or combinations thereof.

Each of the first to third low-k insulating films 312, 322 and 332 is illustrated as being a single layer, but this is only for convenience of explanation, and the present disclosure is not limited thereto. For example, each of the first to third low-k insulating films 312, 322 and 332 may be formed by stacking a plurality of insulating films.

The first to third wiring patterns 314, 324 and 334 may be formed in the first to third low-k insulating films 312, 322 and 332, respectively.

In some embodiments, the first and second wiring patterns 314 and 324 may be electrically connected to the first and second integrated circuit elements TR1 and TR2 on the substrate 100, respectively. For example, a first lower via 210 which penetrates the first interlayer insulating film 200 to connect the first integrated circuit element TR1 and the first wiring pattern 314 may be formed. Further, for example, a second lower via 220 which penetrates the first interlayer insulating film 200 to connect the second integrated circuit element TR2 and the second wiring pattern 324 may be formed.

In some embodiments, the first lower via 210 and the second lower via 220 may be formed at the same level.

The third wiring pattern 334 may include various item patterns in the item region CR. For example, the third wiring pattern 334 may include the item patterns such as a TEG module, an alignment key, and a MI.

The first to third wiring patterns 314, 324 and 334 may include a conductive material. For example, the first to third wiring patterns 314, 324, and 334 may include, but are not limited to, metal such as tungsten, nickel, cobalt and tantalum, a metal silicide such as tungsten silicide, nickel silicide, cobalt silicide and tantalum silicide, polysilicon doped with impurities, or combinations thereof.

In some embodiments, the first to third wiring structures 310, 320 and 330 may be formed at the same level. In the present specification, "the same level" means that the wiring structures are formed by the same fabricating operation or process. For example, the first to third low-k insulating films 312, 322 and 332 may have substantially the same material composition, and the first to third wiring patterns 314, 324 and 334 may have substantially the same material composition.

In some embodiments, the heights of the bottom surfaces of the first to third low-k insulating films 312, 322 and 332 may be substantially the same relative to the substrate 100. For example, on the basis of the top surface of the substrate 100, a height H11 of the bottom surface of the first low-k insulating film 312 may be substantially the same as a height H12 of the bottom surface of the third low-k insulating film 332.

The second interlayer insulating film 400 may be formed on the first to third wiring structures 310, 320 and 330. The second interlayer insulating film 400 is illustrated as being a single layer in FIG. 4, but this is only for convenience of explanation, and the present disclosure is not limited thereto. For example, the second interlayer insulating film 400 may be formed by stacking a plurality of insulating films.

In some embodiments, first to third conductive films 414, 424 and 434 may be formed in the second interlayer insulating film 400. The first conductive film 414 may be formed in the second interlayer insulating film 400 of the first chip region MC1, the second conductive film 424 may be formed in the second interlayer insulating film 400 of the second chip region MC2, and the third conductive film 434 may be formed in the second interlayer insulating film 400 of the item region CR.

In some embodiments, the first to third wiring patterns 314, 324 and 334 may be electrically connected to the first to third conductive films 414, 424 and 434, respectively. For example, a first upper via 412 which penetrates the second interlayer insulating film 400 to connect the first wiring pattern 314 and the first conductive film 414 may be formed. Further, for example, a second upper via 422 which penetrates the second interlayer insulating film 400 to connect the second wiring pattern 324 and the second conductive film 424 may be formed. Further, for example, a third upper via 432 which penetrates the second interlayer insulating film 400 to connect the third wiring pattern 334 and the third conductive film 434 may be formed.

In some embodiments, the first to third conductive films 414, 424, 434 may be formed at the same level. Also, in some embodiments, the first to third upper vias 412, 422, 432 may be formed at the same level.

The first interlayer insulating film 200 and the second interlayer insulating film 400 may include, for example, silicon oxide, silicon nitride, silicon oxynitride, FOX (Flowable Oxide), TOSZ (Tonen SilaZene), USG (Undoped Silica Glass), BSG (Borosilica Glass), PSG (PhosphoSilica Glass), BPSG (BoroPhosphoSilica Glass), TEOS (TetraEthyl OrthoSilicate), PETEOS (Plasma Enhanced TetraEthyl OrthoSilicate), FSG (Fluoride Silicate Glass), CDO (Carbon Doped Silicone Oxide), Xerogel, Aerogel, Amorphous Fluorinated Carbon, OSG (Organo Silicate Glass), Parylene, BCB (bis-benzocyclobutenes), SiLK, polyimide, porous polymeric material or combinations thereof.

The first protective insulating film 340 may be interposed between the first low-k insulating film 312 and the third low-k insulating film 332. For example, a first trench T1 may be formed in the low-k insulating films 312, 322 and 332 in the first protective region PR1. In some embodiments, a bottom surface of the first trench T1 may expose a part of the top surface of the first interlayer insulating film 200. The first protective insulating film 340 may fill the first trench T1. As a result, the first protective insulating film 340 may be formed on the first interlayer insulating film 200 in the first protective region PR1. In some embodiments, the first protective insulating film 340 may surround the first chip region MC1.

The second protective insulating film 350 may be interposed between the second low-k insulating film 322 and the third low-k insulating film 332. For example, a second trench T2 may be formed in the low-k insulating film 312, 322 and 332 in the second protective region PR2. In some embodiments, a bottom surface of the second trench T2 may expose a part of the top surface of the first interlayer insulating film 200. The second protective insulating film 350 may fill the second trench T2. As a result, the second protective insulating film 350 may be formed on the first interlayer insulating film 200 in the second protective region PR2. In some embodiments, the second protective insulating film 350 may surround the second chip region MC2.

The first protective insulating film 340 and the second protective insulating film 350 may include, for example, silicon oxide, silicon nitride, silicon oxynitride, FOX (Flowable Oxide), TOSZ (Tonen SilaZene), USG (Undoped Silica Glass), BSG (Borosilica Glass), PSG (PhosphoSilica Glass), BPSG (BoroPhosphoSilica Glass), TEOS (TetraEthyl OrthoSilicate), PETEOS (Plasma Enhanced TetraEthyl OrthoSilicate), FSG (Fluoride Silicate Glass), CDO (Carbon Doped silicon Oxide), Xerogel, Aerogel, Amorphous Fluorinated Carbon, OSG (Organo Silicate Glass), Parylene, BCB (bis-benzocyclobutenes), SiLK, polyimide, porous polymeric material, or combinations thereof.

In some embodiments, the first protective insulating film 340 and the second protective insulating film 350 may include a second insulating material different from the first insulating material of the films 312, 322, 332. In some embodiments, the second insulating material may include a silicon oxide having a higher dielectric constant than that of the first insulating material. For example, the first protective insulating film 340 and the second protective insulating film 350 may include TEOS (TetraEthyl OrthoSilicate).

In some embodiments, the first protective insulating film 340 and the second protective insulating film 350 may include the same material as the first interlayer insulating film 200 and/or the second interlayer insulating film 400. For example, the first protective insulating film 340, the second protective insulating film 350, the first interlayer insulating film 200 and the second interlayer insulating film 400 may include the same silicon oxide. For example, the first protective insulating film 340, the second protective insulating film 350, the first interlayer insulating film 200 and the second interlayer insulating film 400 may include TEOS (TetraEthyl OrthoSilicate).

FIG. 4 illustrates a boundary between the first protective insulating film 340 and the first interlayer insulating film 200, and a boundary between the first protective insulating film 340 and the second interlayer insulating film 400, but this is only for convenience of explanation, and the present disclosure is not limited thereto. For example, when the first protective insulating film 340, the first interlayer insulating film 200 and the second interlayer insulating film 400 have the same material configuration, a boundary between the first protective insulating film 340 and the first interlayer insulating film 200 and/or a boundary between the first protective insulating film 340 and the second interlayer insulating film 400 may not exist or may not be visible. Similarly, a boundary between the second protective insulating film 350 and the first interlayer insulating film 200 and/or a boundary between the second protective insulating film 350 and the second interlayer insulating film 400 may not exist or may not be visible.

In some embodiments, the height of the bottom surfaces of the first and second protective insulating films 340 and 350 may be lower than the height of the bottom surfaces of the first to third low-k insulating films 312, 322 and 332 relative to the substrate 100. For example, on the basis of the top surface of the substrate 100, a height H13 of the bottom surface of the first protective insulating film 340 may be lower than the height H11 of the bottom surface of the first low-k insulating film 312 and the height H12 of the bottom surface of the third low-k insulating film 332.

In some embodiments, a capping insulating film 410 may be further formed on the second interlayer insulating film 400. In FIG. 4, the capping insulating film 410 is illustrated as on or covering the top surfaces of the first and second protective insulating films 340 and 350, but the present disclosure is not limited thereto. For example, the first and second protective insulating films 340 and 350 may be formed to penetrate or extend through the capping insulating film 410.

The capping insulating film 410 may include, but is not limited to, for example, silicon nitride and/or silicon oxynitride.

Figure 5:
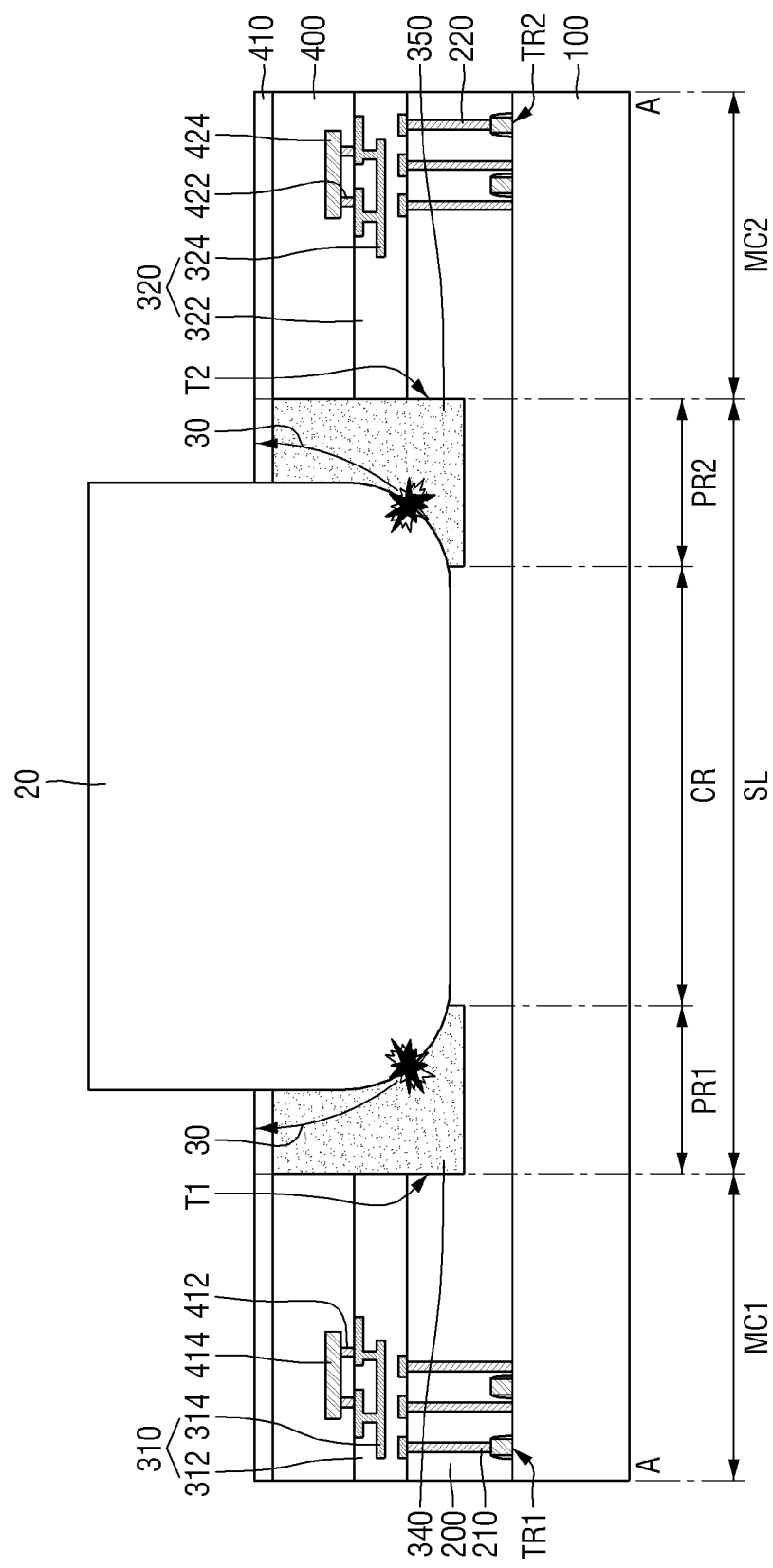
FIG. 5 is a view illustrating a protective insulating film of a semiconductor device according to some embodiments of the present inventive concepts.

FIG. 5 is a view illustrating a protective insulating film of a semiconductor device according to some embodiments of the present inventive concepts.

Referring to FIGS. 1 to 5, the first chip region MC1 and the second chip region MC2 may be separated from each other, by the die sawing process performed along the scribe lane region SL. For example, the sawing blade 20 may be provided in the scribe lane region SL and the second interlayer insulating film 400, and the first interlayer insulating film 200 and the substrate 100 may be sequentially cut by the sawing blade 20.

While FIG. 5 illustrates that the die sawing process is performed by the sawing blade 20, it is only an example, and the present disclosure is not limited thereto. For example, the above die sawing process may be executed by other processes such as a laser sawing process. For example, a laser may be provided in the scribe lane region SL to sequentially cut the second interlayer insulating film 400, the first interlayer insulating film 200 and the substrate 100.

Meanwhile, while the sawing blade 20 performs the die sawing process along the scribe lane region SL, the sawing blade 20 may induce stress such as physical friction to the low-k insulating film 312, 322 which may be vulnerable to stress. Such a stress may induce cracks 30 which develop inside a semiconductor device, which causes a reduction in reliability and/or productivity/production of the semiconductor chip in the chip region MC.

However, in a semiconductor device according to some embodiments, by forming the protective region PR in which the protective insulating film (for example, the first and second protective insulating films 340 and 350) is formed in the scribe lane region SL adjacent to the chip region MC, it is possible to effectively reduce or prevent the cracks 30 due to the sawing blade 20 or other singulation processes from being developed. Therefore, a semiconductor device with improved reliability and/or productivity/production can be provided.

In addition, in a semiconductor device according to some embodiments, by forming the protective region PR between the item region CR and the chip region MC, various item patterns for a semiconductor device may coexist with the wiring patterns in the chip region MC.

Further, in a semiconductor device according to some embodiments, when the protective insulating film including the same material as the interlayer insulating film (for example, the first and second interlayer insulating films 200 and 400) is formed in the protective region PR (for example, the first and second protective insulating films 340 and 350), it is possible to reduce or minimize the steps (e.g., fabrication steps) and/or structural deformation of a semiconductor device.

Figure 6:
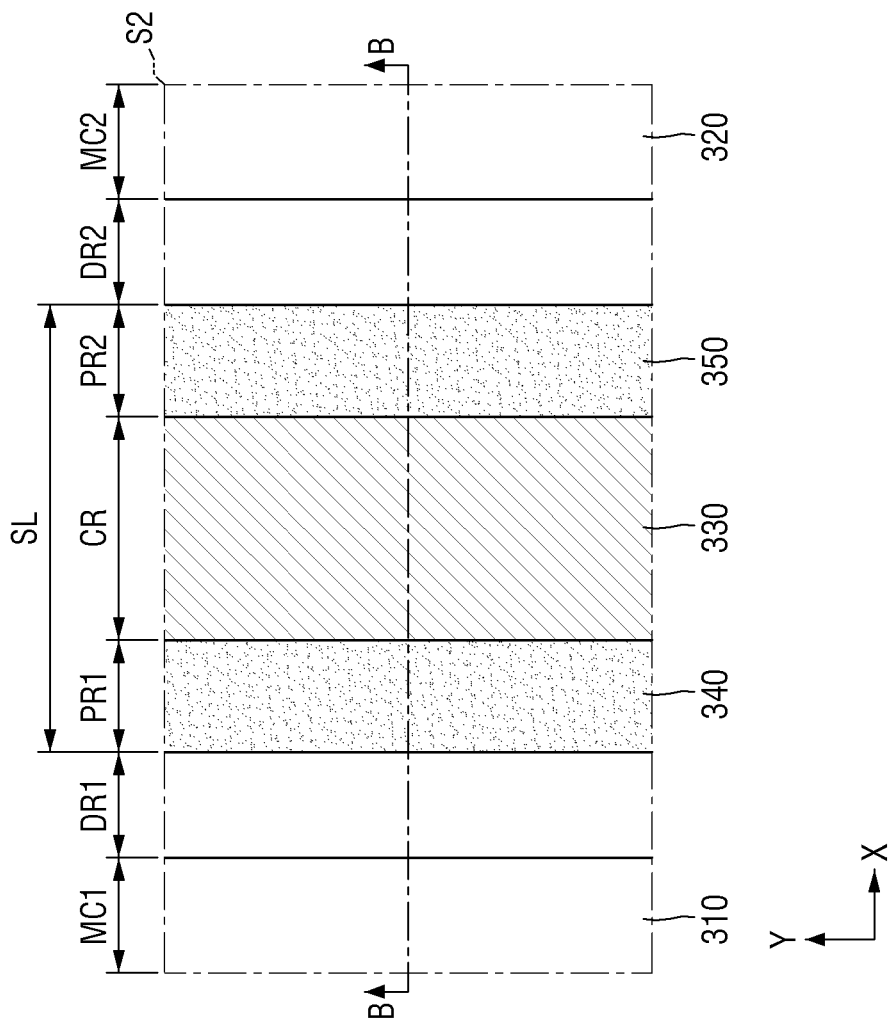
FIG. 6 is a schematic layout diagram of a semiconductor device according to some embodiments of the present inventive concepts.

FIG. 6 is a schematic layout diagram of a semiconductor device according to some embodiments of the present inventive concepts. FIGS. 7 to 10 are various cross-sectional views taken along B-B of FIG. 6. For convenience of explanation, repeated parts of description provided with reference to FIGS. 1 to 5 will be briefly described or omitted.

Figure 7:
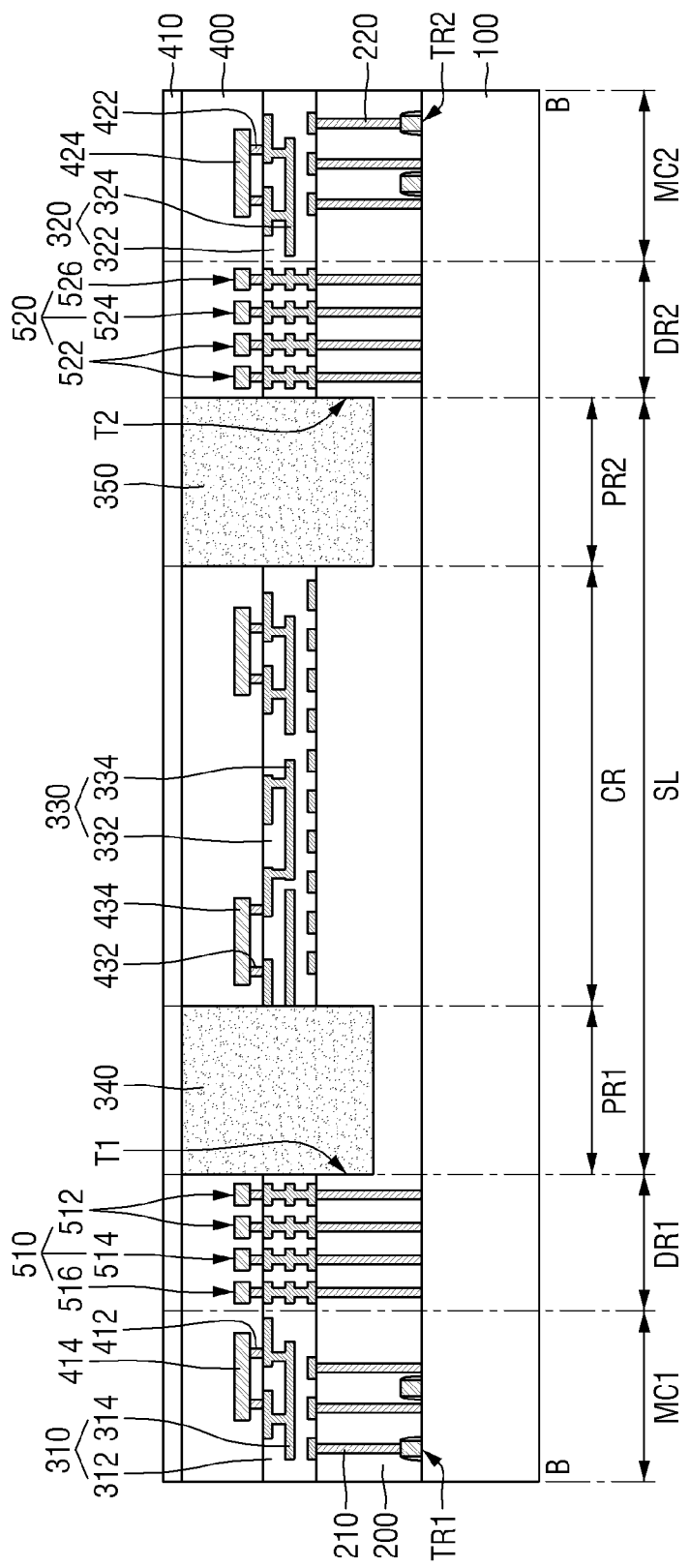
FIGS. 7 to 9 are various cross-sectional views taken along line B-B of FIG. 6.

Referring to FIGS. 6 and 7, in a semiconductor device according to some embodiments, the substrate 100 further includes a first peripheral region DR1 and a second peripheral region DR2.

The first peripheral region DR1 may be interposed between the first chip region MC1 and the first protective region PR1, and the second peripheral region DR2 may be interposed between the second chip region MC2 and the second protective region PR2. In some embodiments, the first peripheral region DR1 may surround the first chip region MC1, and the second peripheral region DR2 may surround the second chip region MC2.

In some embodiments, a wiring structure may be formed in the first peripheral region DR1 or the second peripheral region DR2. For example, a first peripheral wiring structure 510 may be formed in the first peripheral region DR1, and a second peripheral wiring structure 520 may be formed in the second peripheral region DR2.

In FIG. 7, the first peripheral region DR1 and the second peripheral region DR2 are illustrated to include the wiring structure, but the present disclosure is not limited thereto. For example, one of the first peripheral region DR1 and the second peripheral region DR2 may not include the wiring structure.

Further, although the first peripheral wiring structure 510 is illustrated as being formed of the first lower via 210, the first wiring pattern 314, the first upper via 412 and the first conductive film 414, the present disclosure is not limited thereto. Similarly, although the second peripheral wiring structure 520 is illustrated as being formed of the second lower via 220, the second wiring pattern 324, the second upper via 422 and the second conductive film 424, the present disclosure is not limited thereto.

In some embodiments, the first peripheral wiring structure 510 may include a first dam structure 512, a first guard ring structure 514, and a first crack detection circuit (CDC) structure 516 arranged sequentially in a direction from the scribe lane region SL to the first chip region MC1. Similarly, the second peripheral wiring structure 520 may include a second dam structure 522, a second guard ring structure 524 and a second crack detection circuit structure 526 arranged sequentially in a direction from the scribe lane region SL to the second chip region MC2.

The first and second dam structures 512 and 522 may block cracks (e.g., 30 of FIG. 5) caused by the sawing blade 20 from being developed to the chip region MC. The first and second guard ring structures 514 and 524 may surround the chip region MC in a ring shape or a loop shape. The first and second crack detection circuit structures 516 and 526 may include a circuit for detecting a crack (e.g., 30 of FIG. 5) caused by the sawing blade 20.

Figure 8:
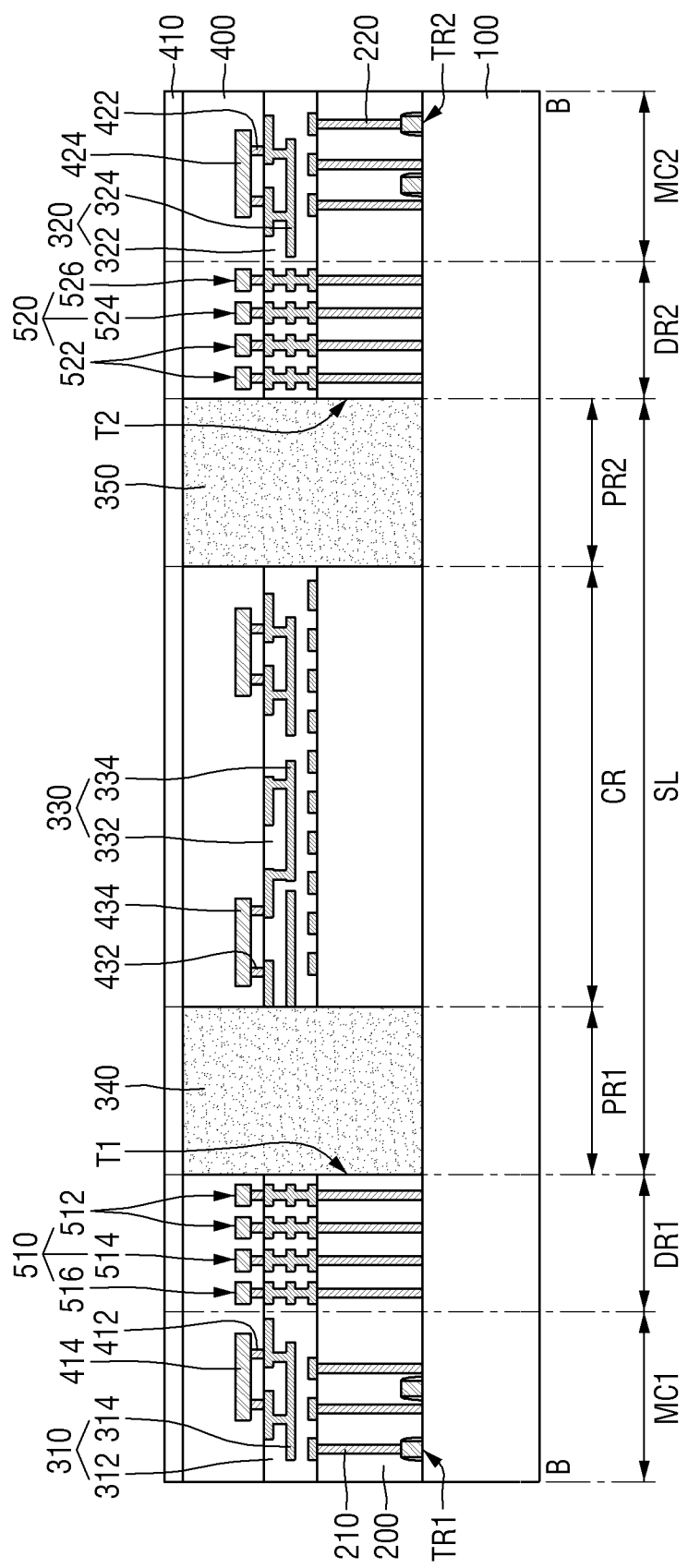

Referring to FIGS. 6 and 8, in a semiconductor device according to some embodiments, the first and second protective insulating films 340 and 350 extend to and contact the top surface of the substrate 100.

For example, the bottom surfaces of the first and second trenches T1 and T2 may expose the top surface of the substrate 100. As a result, the bottom surfaces of the first and second protective insulating films 340 and 350 may come into contact with the top surface of the substrate 100.

Figure 9:
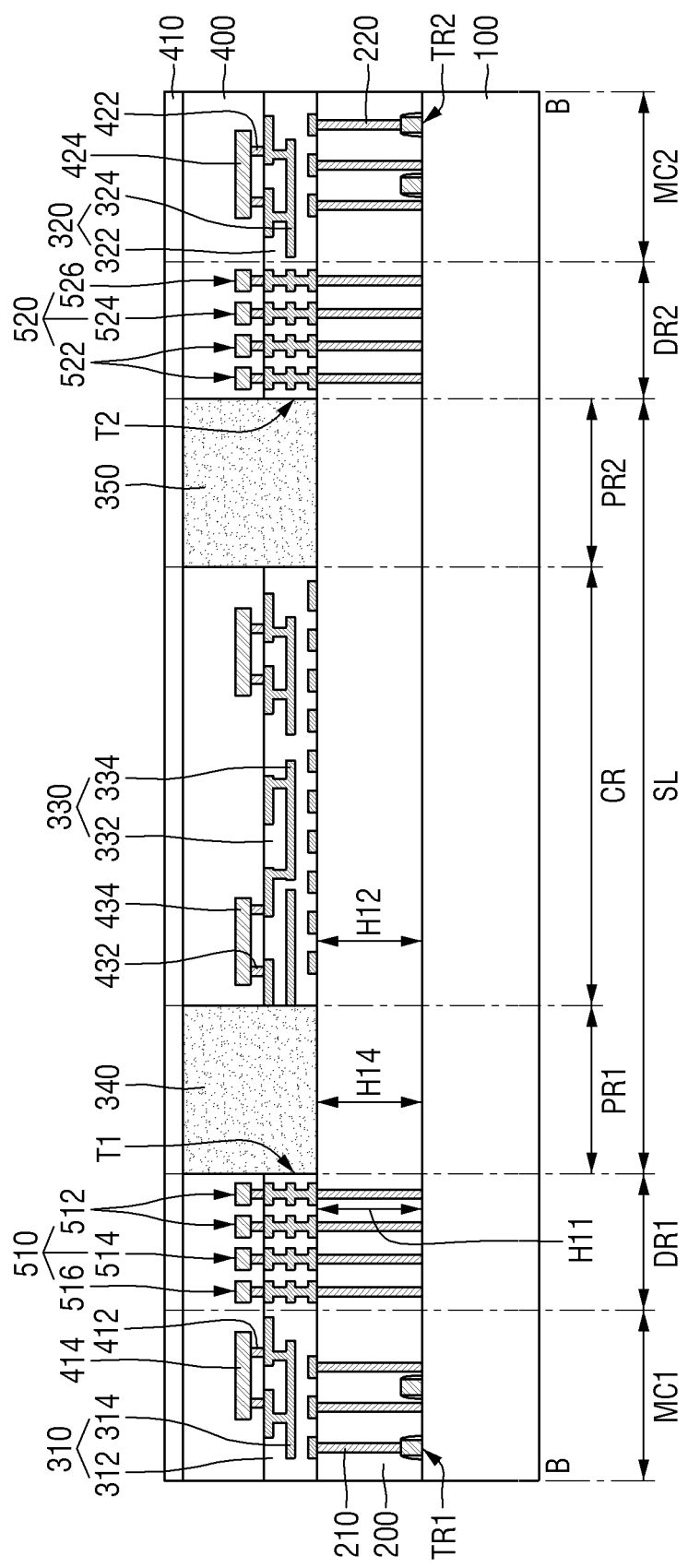

Referring to FIGS. 6 and 9, in a semiconductor device according to some embodiments, the height of the bottom surfaces of the first and second protective insulating films 340 and 350 is substantially the same as the height of the bottom surfaces of the first to third low-k insulating films 312, 322 and 332 relative to the substrate 100.

For example, on the basis of the top surface of the substrate 100, a height H14 of the bottom surface of the first protective insulating film 340 may be substantially the same as the height H11 of the bottom surface of the first low-k insulating film 312 and the height H12 of the bottom surface of the third low-k insulating film 332.

Figure 10:
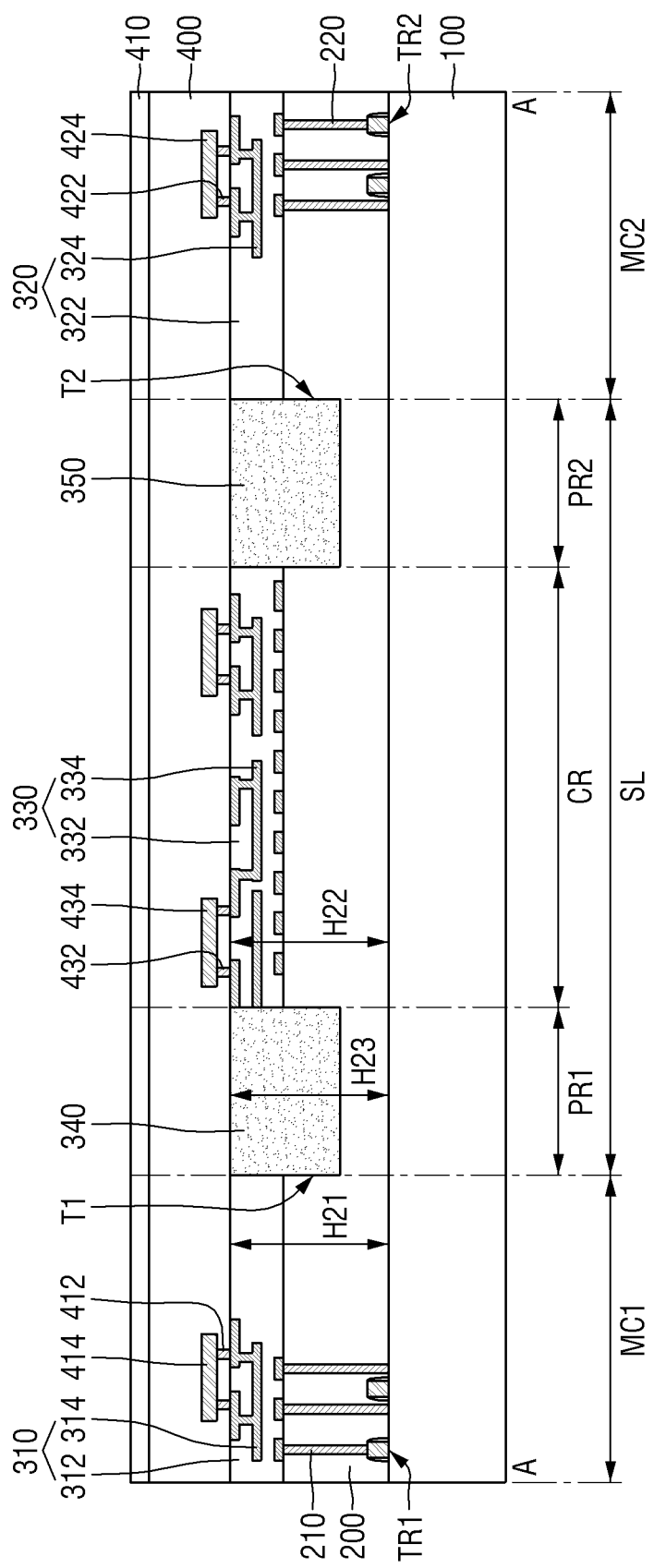
FIG. 10 is a cross-sectional view illustrating a semiconductor device according to some embodiments of the present inventive concepts.

FIG. 10 is a cross-sectional view illustrating a semiconductor device according to some embodiments of the present inventive concepts. For convenience of explanation, repeated parts of description provided with reference to FIGS. 1 to 5 will be briefly described or omitted.

Referring to FIGS. 3 and 10, in a semiconductor device according to some embodiments, the height of the top surfaces of the first and second protective insulating films 340 and 350 is substantially the same as the height of the top surfaces of the first to third low-k insulating films 312, 322 and 332 relative to the substrate 100.

For example, on the basis of the top surface of the substrate 100, a height H23 of the top surface of the first protective insulating film 340 may be substantially the same as a height H21 of the top surface of the first low-k insulating film 312 and a height H22 of the top surface of the third low-k insulating film 332.

FIG. 10 illustrates that the height of the bottom surfaces of the first and second protective insulating films 340 and 350 is lower than the height of the bottom surfaces of the first to third low-k insulating films 312, 322 and 332 relative to the substrate 100, but the present disclosure is not limited thereto. For example, as described above with reference to FIGS. 8 and 9, the heights of the bottom surfaces of the first and second protective insulating films 340 and 350 may various.

Figure 11:
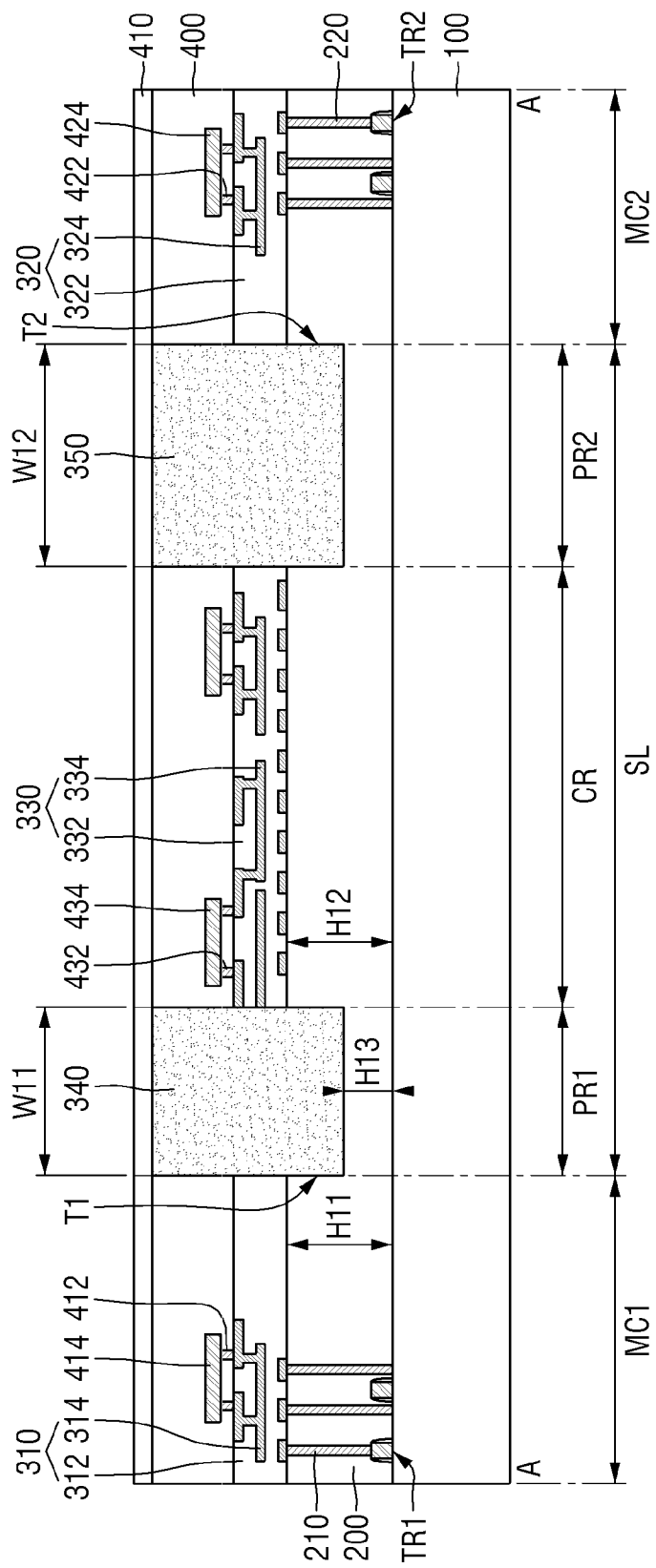
FIG. 11 is a cross-sectional view illustrating a semiconductor device according to some embodiments of the present inventive concepts.

FIG. 11 is the cross-sectional view illustrating a semiconductor device according to some embodiments of the present inventive concepts. For convenience of explanation, repeated parts of description provided with reference to FIGS. 1 to 5 will be briefly described or omitted.

Referring to FIG. 11, in a semiconductor device according to some embodiments, a distance at which the first low-k insulating film 312 and the third low-k insulating film 332 are spaced is different from a distance at which the second low-k insulating film 322 and the third low-k insulating film 332 are spaced.

For example, the width W11 of the first protective insulating film 340 may be different from the width W12 of the second protective insulating film 350. Here, the width means the width in a direction (for example, the first direction X) in which the first to third low-k insulating films 312, 322 and 332 are arranged.

Figure 12:
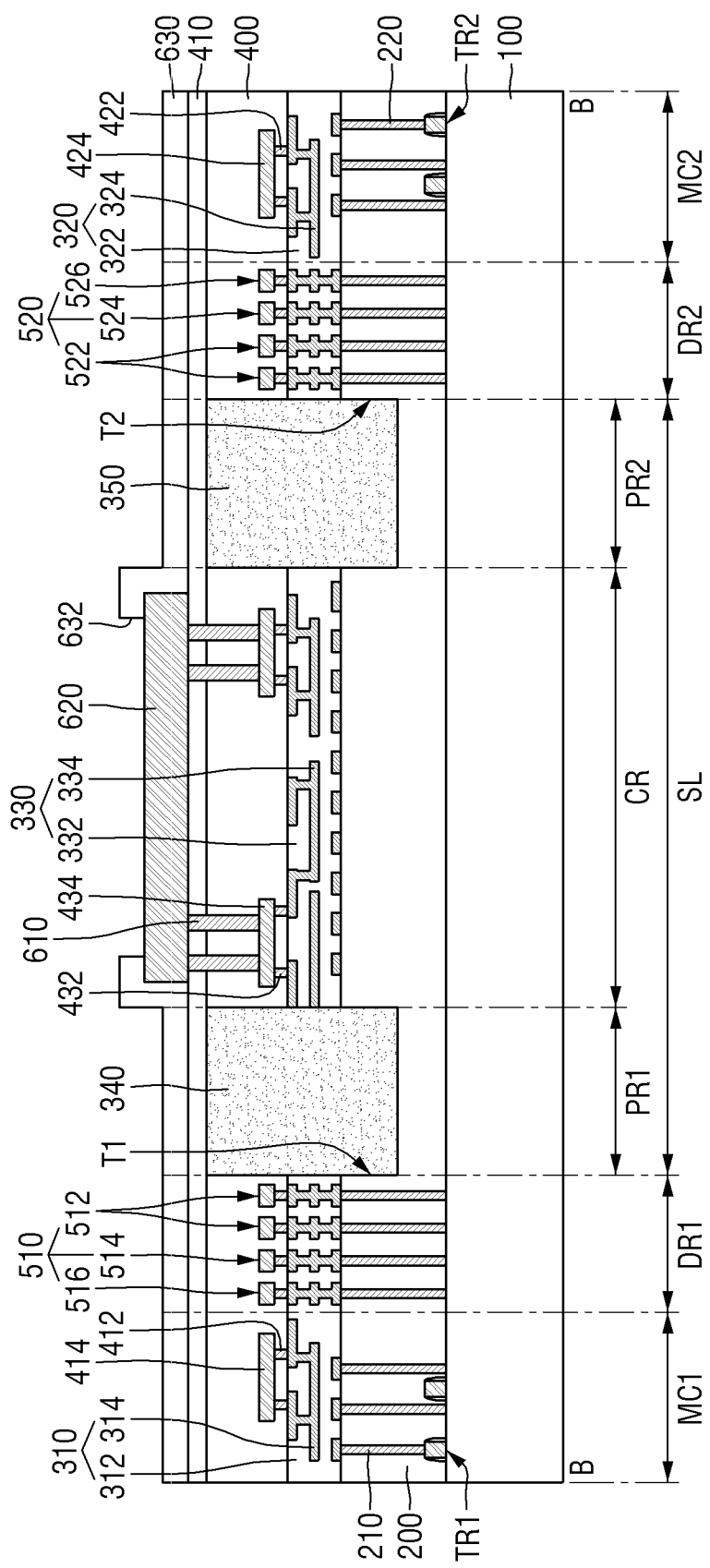
FIG. 12 is a cross-sectional view illustrating a semiconductor device according to some embodiments of the present inventive concepts.

FIG. 12 is a cross-sectional view illustrating a semiconductor device according to some embodiments of the present inventive concepts. For convenience of explanation, repeated parts of description provided with reference to FIGS. 1 to 11 will be briefly described or omitted.

Referring to FIG. 12, a semiconductor device according to some embodiments may further include a conductive pad 620.

The conductive pad 620 may be formed on the second interlayer insulating film 400. In some embodiments, the conductive pad 620 may be formed on the capping insulating film 410.

In some embodiments, the conductive pad 620 may be electrically connected to the third wiring pattern 334. For example, a fourth upper via 610 which penetrates the second interlayer insulating film 400 and the capping insulating film 410 to connect the third conductive film 434 and the conductive pad 620 may be formed.

In some embodiments, a passivation film 630 which exposes the top surface of the conductive pad 620 may be further formed. The passivation film 630 may extend along the top surface of the capping insulating film 410. Further, the passivation film 630 may expose at least a part of the top surface of the conductive pad 620. For example, the passivation film 630 may include an opening 632 which exposes a part of the top surface of the conductive pad 620. The passivation film 630 may include, for example, silicon nitride.

Although the conductive pad 620 is illustrated as being formed only in the item region CR, the present disclosure is not limited thereto. For example, the conductive pads 620 may be formed in the first chip region MC1 and/or the second chip region MC2.

Figure 13:
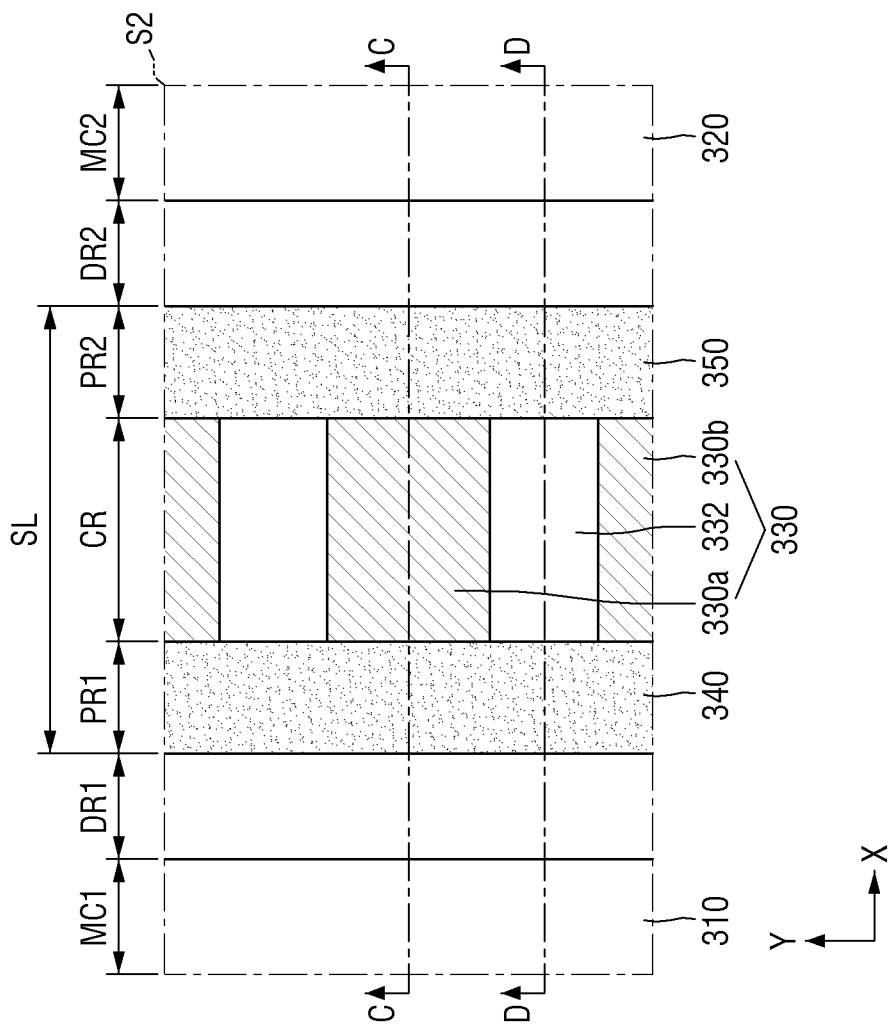
FIG. 13 is a schematic layout diagram of a semiconductor device according to some embodiments of the present inventive concepts.
Figure 14:
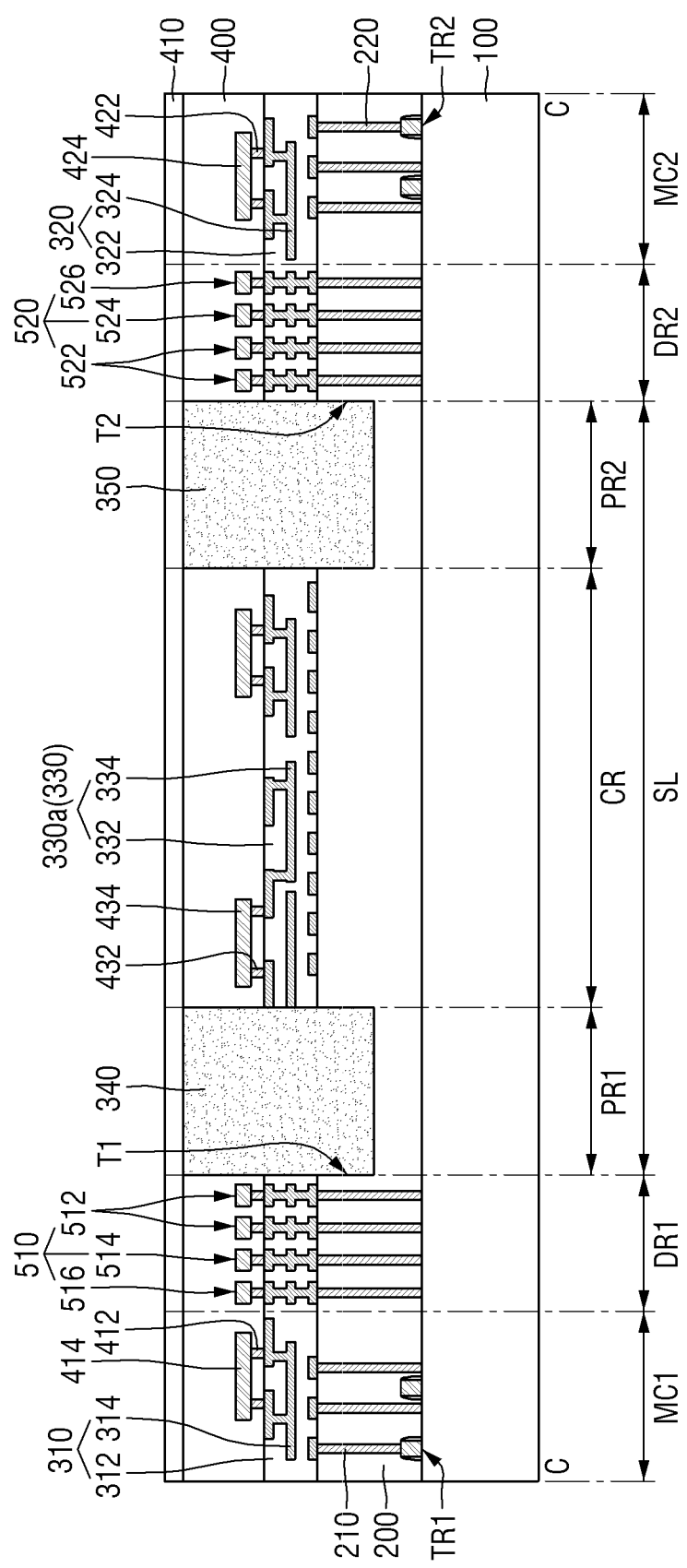
FIG. 14 is a cross-sectional view taken along line C-C of FIG. 13.
Figure 15:
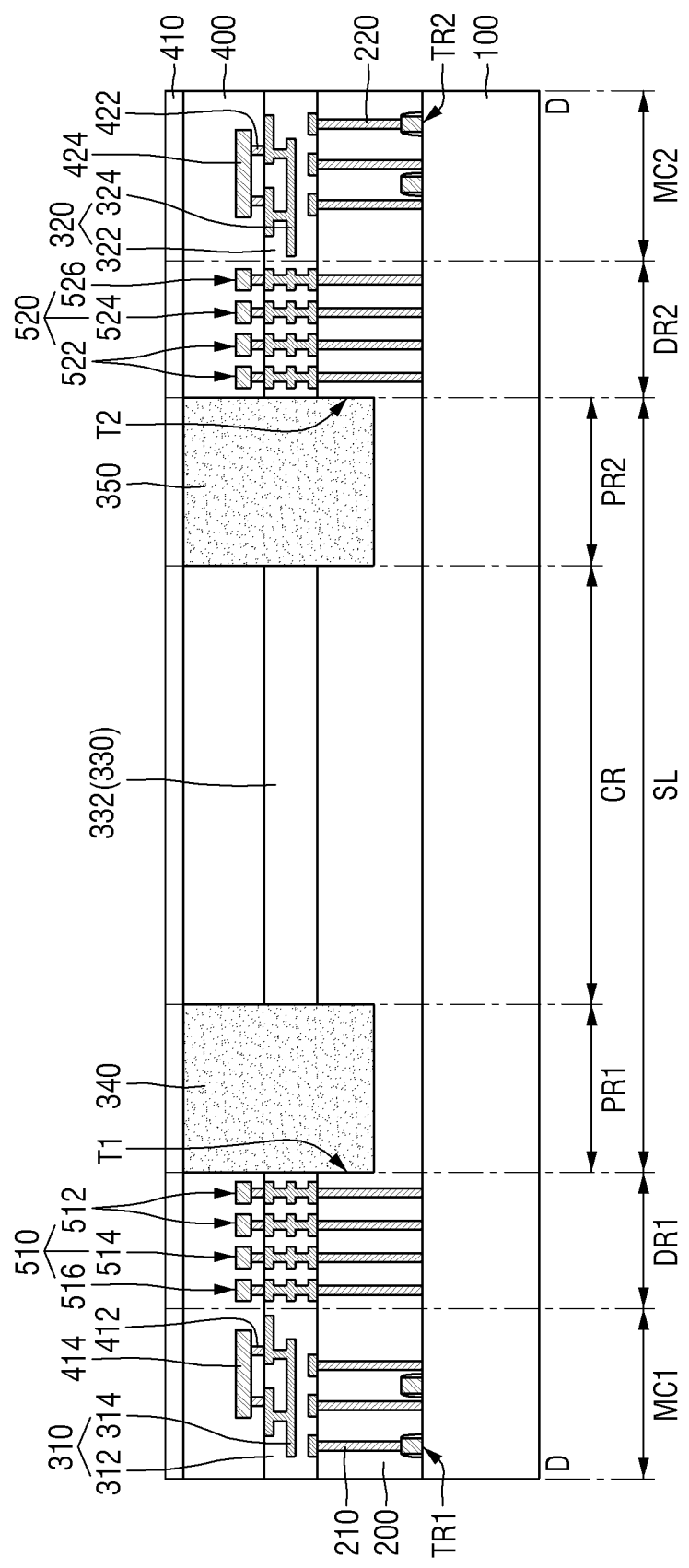
FIG. 15 is a cross-sectional view taken along line D-D of FIG. 13.

FIG. 13 is a schematic layout diagram of a semiconductor device according to some embodiments of the present inventive concepts. FIG. 14 is a cross-sectional view taken along line C-C of FIG. 13. FIG. 15 is a cross-sectional view taken along line D-D of FIG. 13. For convenience of explanation, the repeated parts of description provided with reference to FIGS. 1 to 12 will be briefly explained or omitted.

Referring to FIGS. 13 to 15, in a semiconductor device according to some embodiments, the third wiring structure 330 includes a plurality of item patterns spaced apart from each other.

For example, the third wiring structure 330 may include a first item pattern 330a and a second item pattern 330b that are electrically separated from each other. The first item pattern 330a and the second item pattern 330b may include a third low-k insulating film 332 and a third wiring pattern 334, respectively. Thus, the first item pattern 330a and the second item pattern 330b may include various item patterns in the item region CR. For example, the first item pattern 330a and the second item pattern 330b may include item patterns such as a TEG module, an alignment key, and a MI.

The first item pattern 330a and the second item pattern 330b are illustrated as being arranged in the second direction Y, but the present disclosure is not limited thereto. For example, the first item pattern 330a and the second item pattern 330b may be arranged along various directions such as the first direction X.

In FIGS. 13 and 15, it is illustrated that the third low-k insulating film 332 is interposed between the first item pattern 330a and the second item pattern 330b. For example, a third low-k insulating film 332 in which the third wiring pattern 334 is not formed is formed between the first item pattern 330a and the second item pattern 330b, and it is possible to electrically separate the first item pattern 330a and the second item pattern 330b. However, the present disclosure is not limited thereto, and the third low-k insulating film 332 may not be interposed between the first item pattern 330a and the second item pattern 330b. For example, the first item pattern 330a and the second item pattern 330b may be separated from each other by the first interlayer insulating film 200 and/or the second interlayer insulating film 400.

Figure 16:
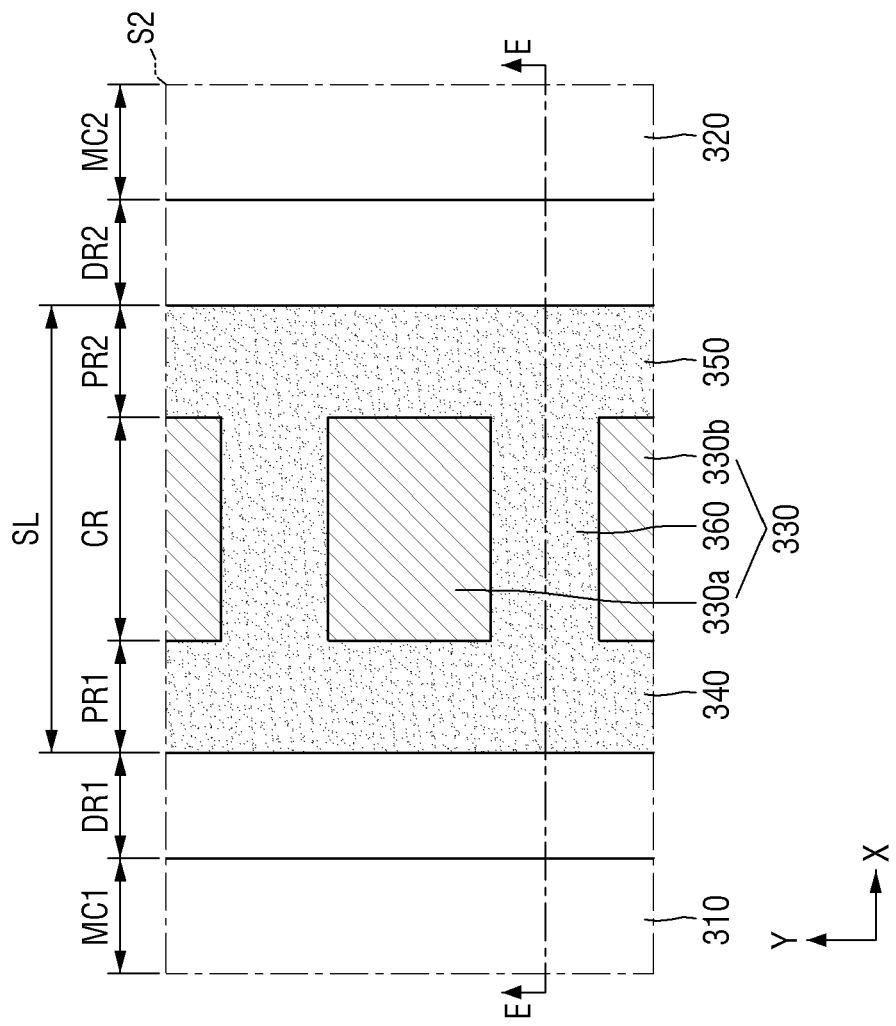
FIG. 16 is a schematic layout diagram of a semiconductor device according to some embodiments of the present inventive concepts.
Figure 17:
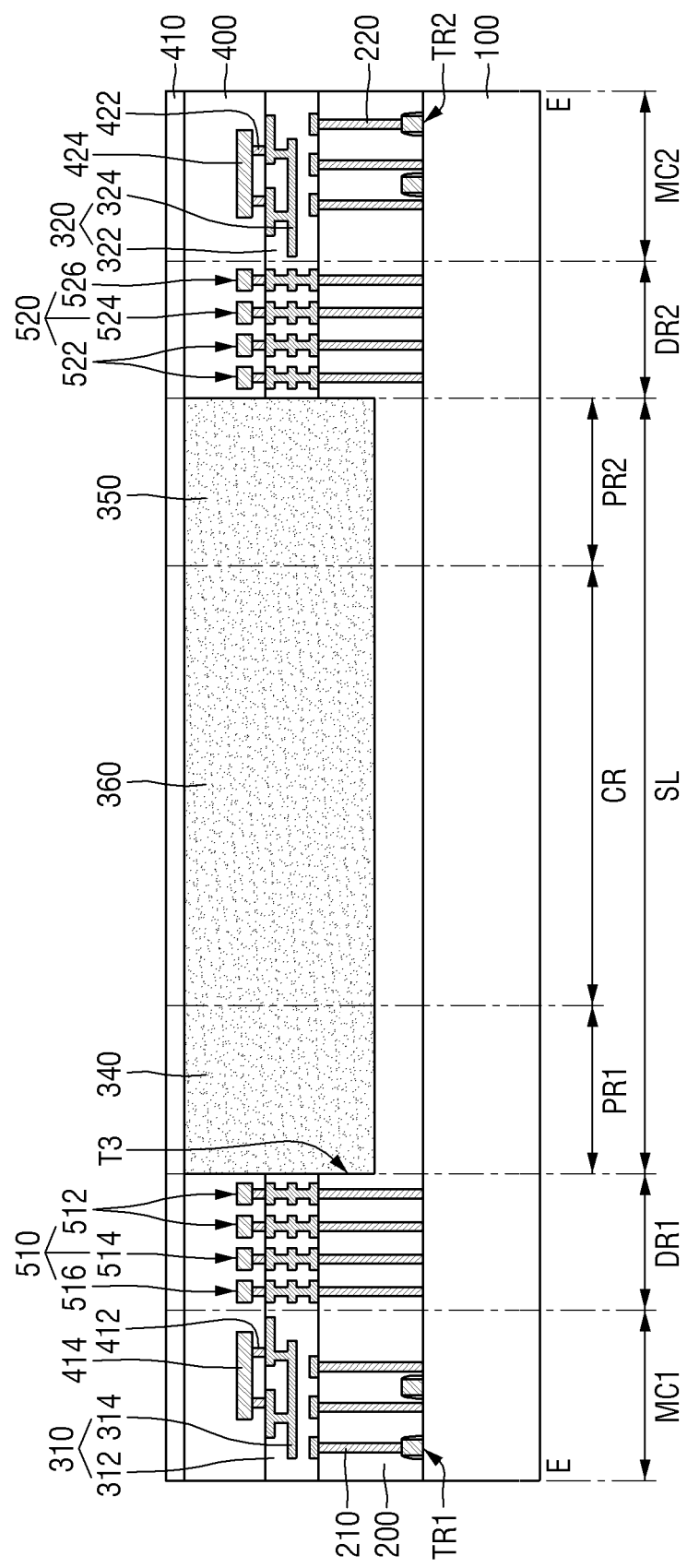
FIG. 17 is a cross-sectional view taken along line E-E of FIG. 16.

FIG. 16 is a schematic layout diagram of a semiconductor device according to some embodiments of the present inventive concepts. FIG. 17 is a cross-sectional view taken along the line E-E of FIG. 16. For convenience of explanation, repeated parts of description provided with reference to FIGS. 1 to 15 will be briefly described or omitted.

Referring to FIGS. 16 and 17, a semiconductor device according to some embodiments further includes a third protective insulating film 360 between the first protective insulating film 340 and the second protective insulating film 350.

The third protective insulating film 360 may be formed in the item region CR. For example, the third protective insulating film 360 may be interposed between the first item pattern 330a and the second item pattern 330b.

In some embodiments, the third protective insulating film 360 may include the second insulating material. For example, the first to third protective insulating films 340, 350 and 360 may include the same silicon oxide. For example, the first to third protective insulating films 340, 350 and 360 may include TEOS (TetraEthyl OrthoSilicate).

In some embodiments, the third protective insulating film 360 may connect portions of the first protective insulating film 340 and the second protective insulating film 350. For example, a third trench T3 may be formed in the low-k insulating film 312, 322 and 332 in the scribe lane region SL. Subsequently, the first to third protective insulating films 340, 350 and 360 for filling the third trench T3 may be formed.

Figure 18:
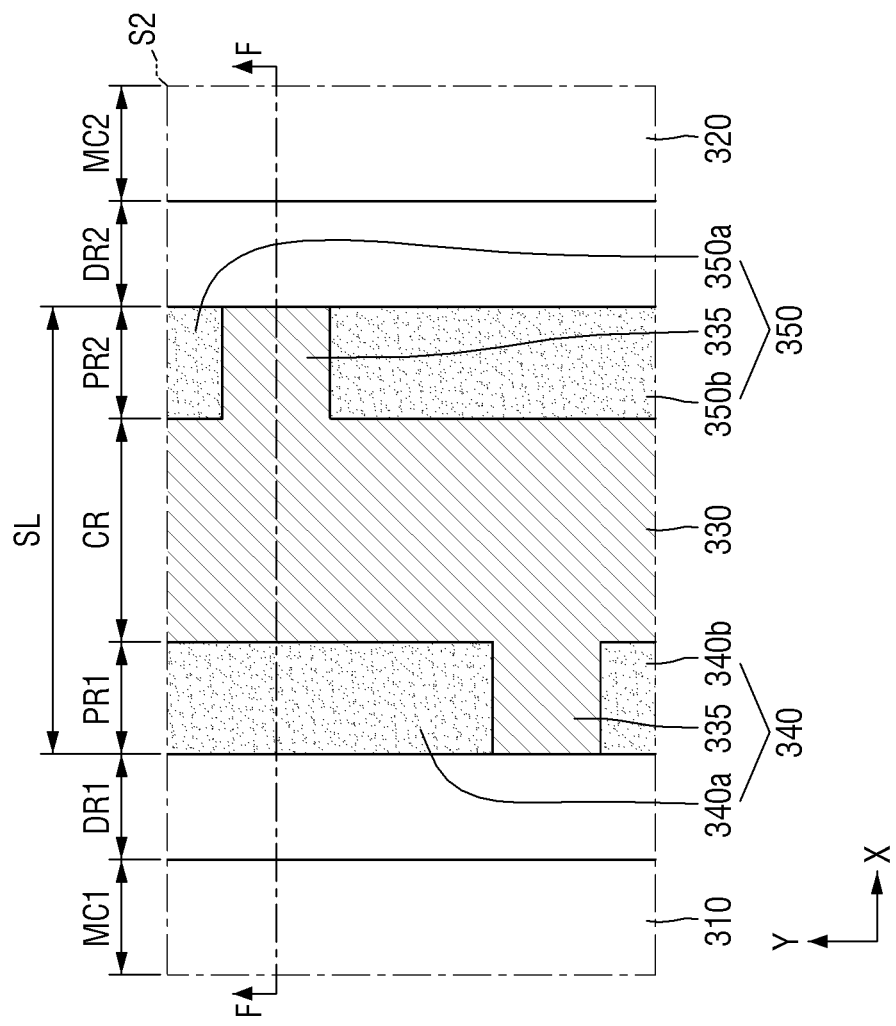
FIG. 18 is a schematic layout diagram of a semiconductor device according to some embodiments of the present inventive concepts.
Figure 19:
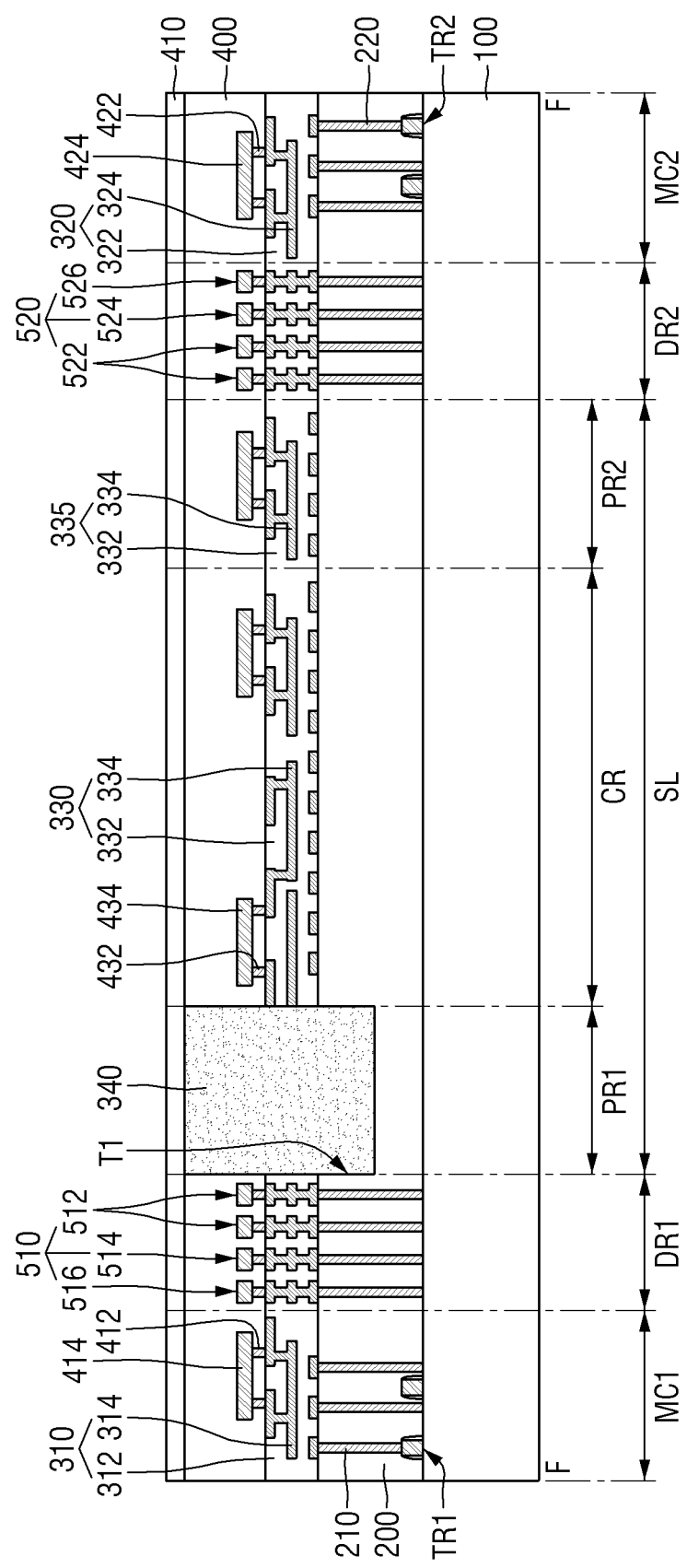
FIG. 19 is a cross-sectional view taken along line F-F of FIG. 18.

FIG. 18 is a schematic layout diagram of a semiconductor device according to some embodiments of the present inventive concepts. FIG. 19 is a cross-sectional view taken along line F-F of FIG. 18. For convenience of explanation, repeated parts of description provided with reference to FIGS. 1 to 17 will be briefly described or omitted.

Referring to FIGS. 18 and 19, in a semiconductor device according to some embodiments, the first protective insulating film 340 and/or the second protective insulating film 350 are discontinuous.

For example, the first protective insulating film 340 may include a first partial protective insulating film 340a and a second partial protective insulating film 340b that are spaced apart from each other. The first partial protective insulating film 340a and the second partial protective insulating film 340b may be arranged, for example, along a second direction Y. Similarly, the second protective insulating film 350 may include a third partial protective insulating film 350a and a fourth partial protective insulating film 350b that are spaced apart from each other.

In some embodiments, a fourth wiring structure 335 may be formed between the first partial protective insulating film 340a and the second partial protective insulating film 340b and/or between the third partial protective insulating film 350a and the fourth partial protective insulating film 350b.

In some embodiments, the fourth wiring structure 335 may include a third low-k insulating film 332 and a third wiring pattern 334. For example, as illustrated in FIG. 19, the third low-k insulating film 332 and the third wiring pattern 334 may extend to the protective region PR (for example, the second protective region PR2). As a result, a fourth wiring structure 335 between the second wiring structure 320 and the third wiring structure 330 may be formed.

Figure 20:
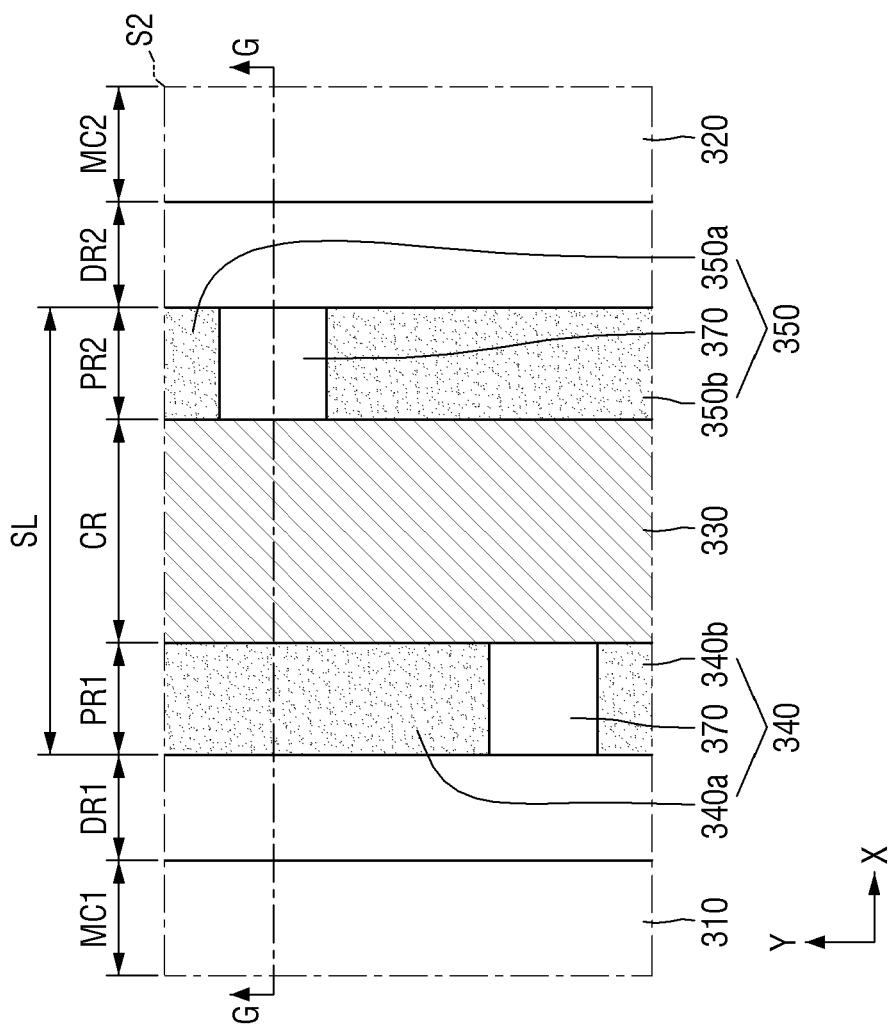
FIG. 20 is a schematic layout diagram of a semiconductor device according to some embodiments of the present inventive concepts.
Figure 21:
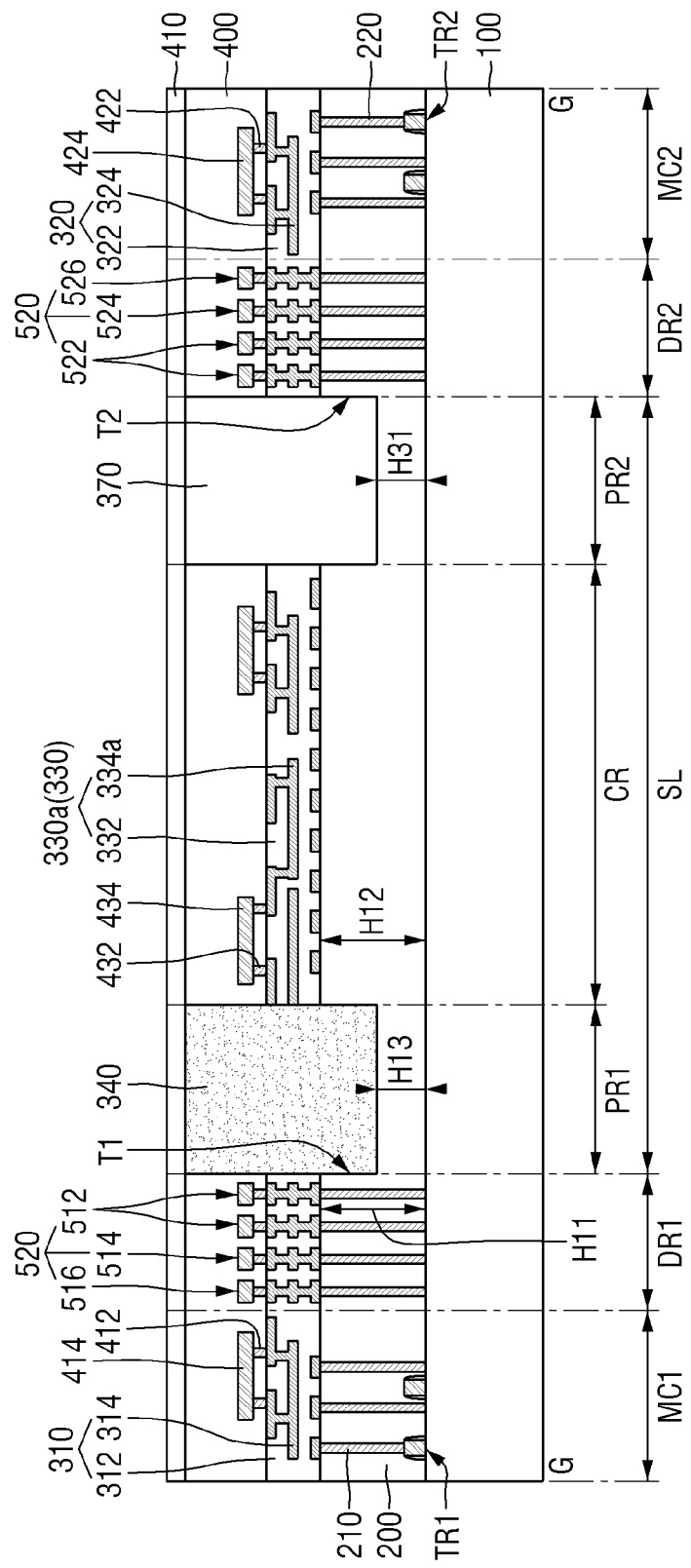
FIG. 21 is a cross-sectional view taken along line G-G of FIG. 20.

FIG. 20 is a schematic layout diagram of a semiconductor device according to some embodiments of the present inventive concepts. FIG. 21 is a cross-sectional view taken along line G-G of FIG. 20. For convenience of explanation, repeated parts of description provided with reference to FIGS. 1 to 19 will be briefly described or omitted.

Referring to FIGS. 20 and 21, a semiconductor device according to some embodiments further includes an insertion insulating film 370 in the protective region PR (for example, the first and second protective regions PR1 and PR2).

The insertion insulating film 370 may be formed, for example, between the first partial protective insulating film 340a and the second partial protective insulating film 340b and/or the third partial protective insulating film 350a and the fourth partial protective insulating film 350b.

In some embodiments, the insertion insulating film 370 may include a third insulating material different from the second insulating material. For example, the third insulating material may be a low-k material having a dielectric constant lower than that of silicon oxide. The first insulating material and the third insulating material may be the same as each other or may be different from each other.

In FIG. 21, a height of the bottom surface of the first protective insulating film 340 is illustrated as being substantially the same as a height of the bottom surface of the insertion insulating film 370 relative to the substrate 100, but the present disclosure is not limited thereto. For example, on the basis of the top surface of the substrate 100, the height H13 of the bottom surface of the first protective insulating film 340 may be different from the height H31 of the bottom surface of the insertion insulating film 370.

Figure 22:
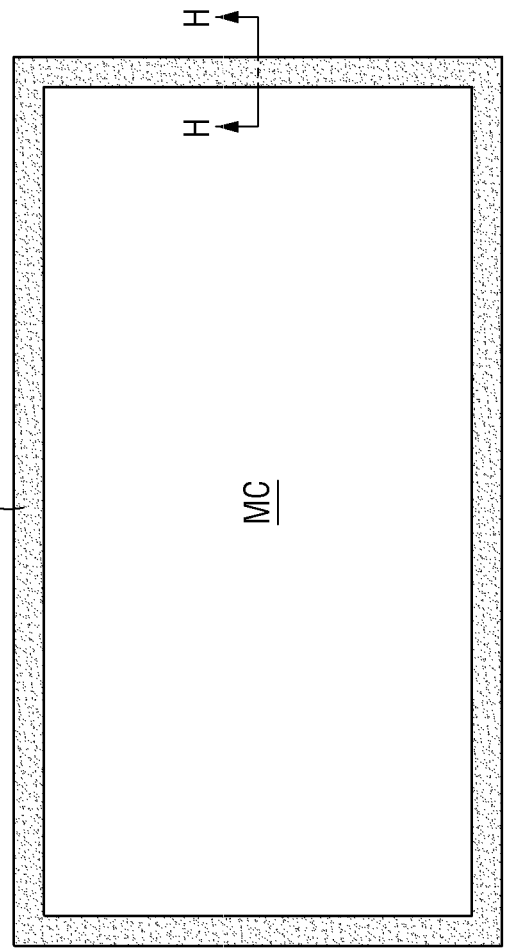
FIG. 22 is a schematic plan view of a semiconductor chip according to some embodiments of the present inventive concepts.
Figure 23:
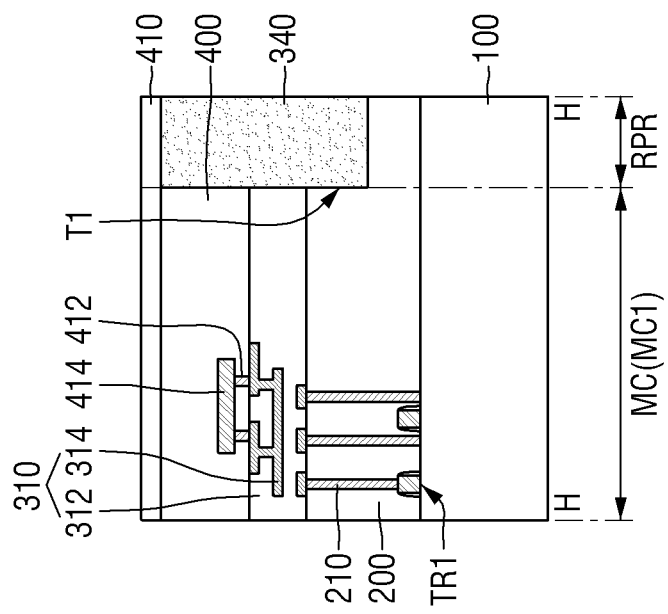
FIG. 23 is a cross-sectional view taken along line H-H of FIG. 22.

FIG. 22 is a schematic plan view of the semiconductor chip according to some embodiments of the present inventive concepts. FIG. 23 is a cross-sectional view taken along line H-H of FIG. 22. For convenience of explanation, repeated parts of description provided with reference to FIGS. 1 to 21 will be briefly described.

FIGS. 22 and 23 illustrate a semiconductor chip including semiconductor devices described with reference to FIGS. 1 to 5, but this is only an example, and the semiconductor chip may be fabricated by the semiconductor device described using FIGS. 6 to 21.

Referring to FIGS. 22 and 23, a semiconductor chip according to some embodiments includes a chip region MC and a residual protective region RPR. For convenience of explanation, the chip region MC is illustratively described as the first chip region MC1 of FIGS. 1 to 5.

The residual protective region RPR may be a part of the scribe lane region SL which is not removed by the die sawing process. For example, as discussed above in the description of FIG. 5, the first chip region MC1 may be cut and separated by the die sawing process which is performed along the scribe lane region SL. The residual protective region RPR may be a part of the protective region PR that is not removed by the die sawing process in the scribe lane region SL surrounding the first chip region MC1. As shown in FIG. 23, the residual protective region RPR may contact portions of the second interlayer insulating film 400 and the first interlayer insulating film 200 and may continuously extend therebetween.

In some embodiments, the residual protective region RPR may completely surround the chip region MC. However, the present disclosure is not limited thereto, and the residual protective region RPR may not completely surround the chip region MC, depending on the die sawing process to be executed.

The first protective insulating film 340 may be formed on the first interlayer insulating film 200 in the residual protective region RPR. In some embodiments, the first protective insulating film 340 may completely surround the chip region MC. However, the present disclosure is not limited thereto, and the first protective insulating film 340 may not completely surround the chip region MC, depending on the semiconductor device to be fabricated (for example, the semiconductor device of FIGS. 17 to 21).

Figure 24:
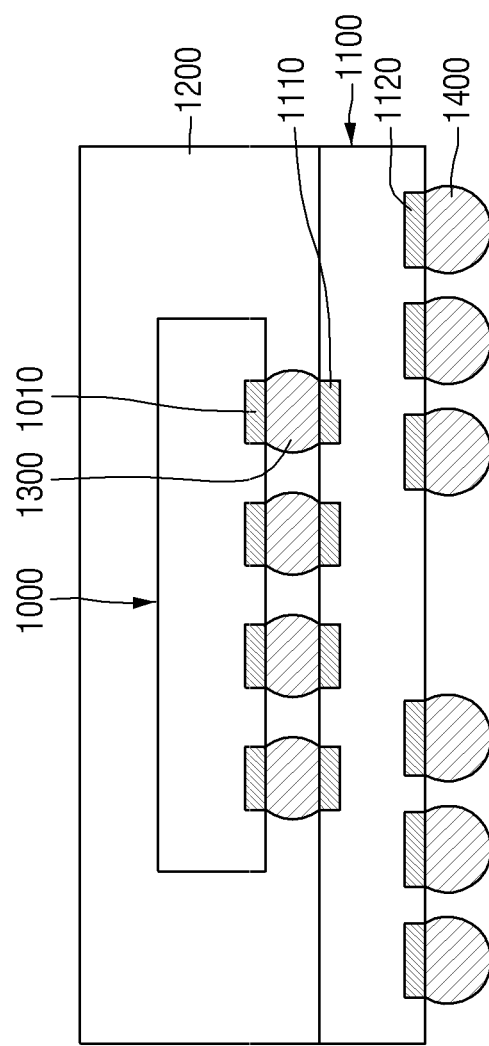
FIG. 24 is a schematic cross-sectional view of a semiconductor package according to some embodiments of the present inventive concepts.

FIG. 24 is a schematic cross-sectional view of a semiconductor package according to some embodiments of the present inventive concepts. For convenience of explanation, repeated parts of description provided with reference to FIGS. 1 to 23 will be briefly described.

Referring to FIG. 24, the semiconductor package according to some embodiments includes a semiconductor chip 1000, a package or packaging substrate 1100 and a molding member 1200.

The semiconductor chip 1000 may be, for example, the semiconductor chip of FIGS. 22 and 23. For example, the semiconductor chip 1000 may be a semiconductor chip including semiconductor devices described with reference to FIGS. 1 to 21.

The semiconductor chip 1000 may be mounted on the package substrate 1100. The package substrate 1100 may be, for example, a printed circuit board (PCB) or a ceramic substrate. In some embodiments, the semiconductor chip 1000 may be electrically connected to the package substrate 1100 by a first connecting member 1300. For example, the first connecting member 1300 may electrically connect a chip pad 1010 of the semiconductor chip 1000 and an upper wiring 1110 of the package substrate 1100.

In some embodiments, the package substrate 1100 may be electrically connected to an external device by a second connecting member 1400. For example, the second connecting member 1400 may electrically connect the lower wiring 1120 of the package substrate 1100 to an external device.

The semiconductor chip 1000 is illustrated as being mounted on the package substrate 1100 by flip chip bonding, but this is only an example, and the semiconductor chip 1000 may be mounted on the package substrate 1100 by various mounting methods such as tab bonding (TAB: Tape Automated Bonding).

The molding member 1200 may be formed on the package substrate 1100. The molding member 1200 may cover the semiconductor chip 1000. The molding member 1200 may protect the semiconductor chip 1000.

The molding member 1200 may include, but is not limited to, for example, an epoxy molding compound (EMC) or polyimide.

Hereinafter, a method for fabricating a semiconductor device according to some embodiments of the present inventive concepts will be described with reference to FIGS. 1 to 31.

Figure 25:
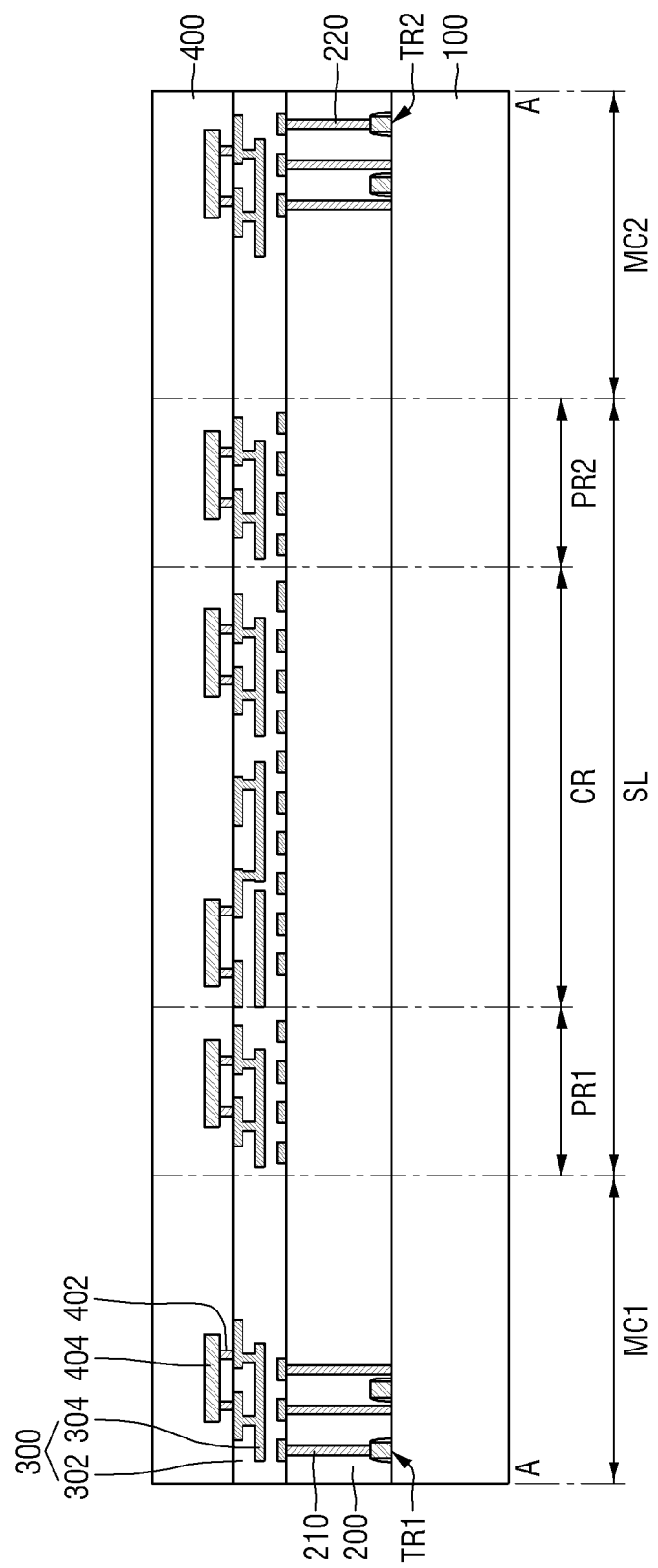
FIGS. 25 to 27 are intermediate step diagrams illustrating a method for fabricating a semiconductor device according to some embodiments of the present inventive concepts.
Figure 26:
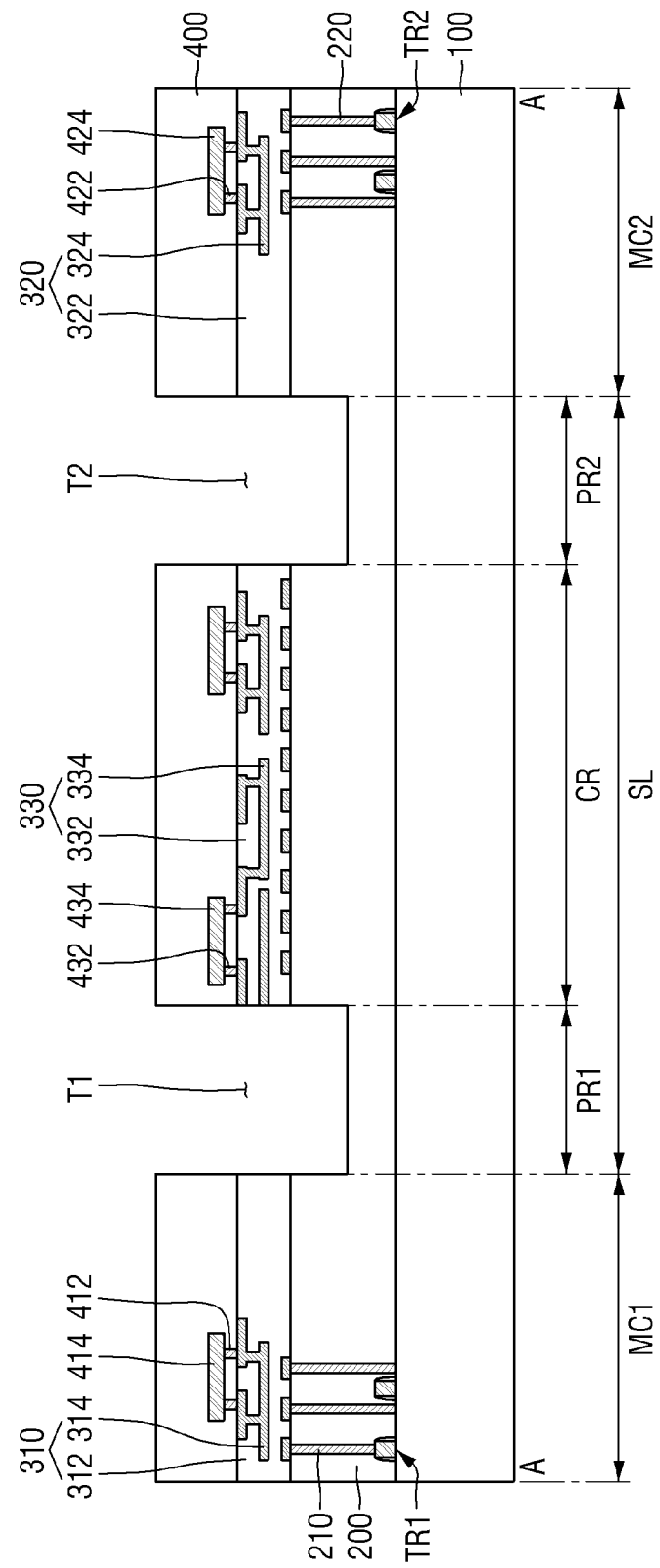
Figure 27:
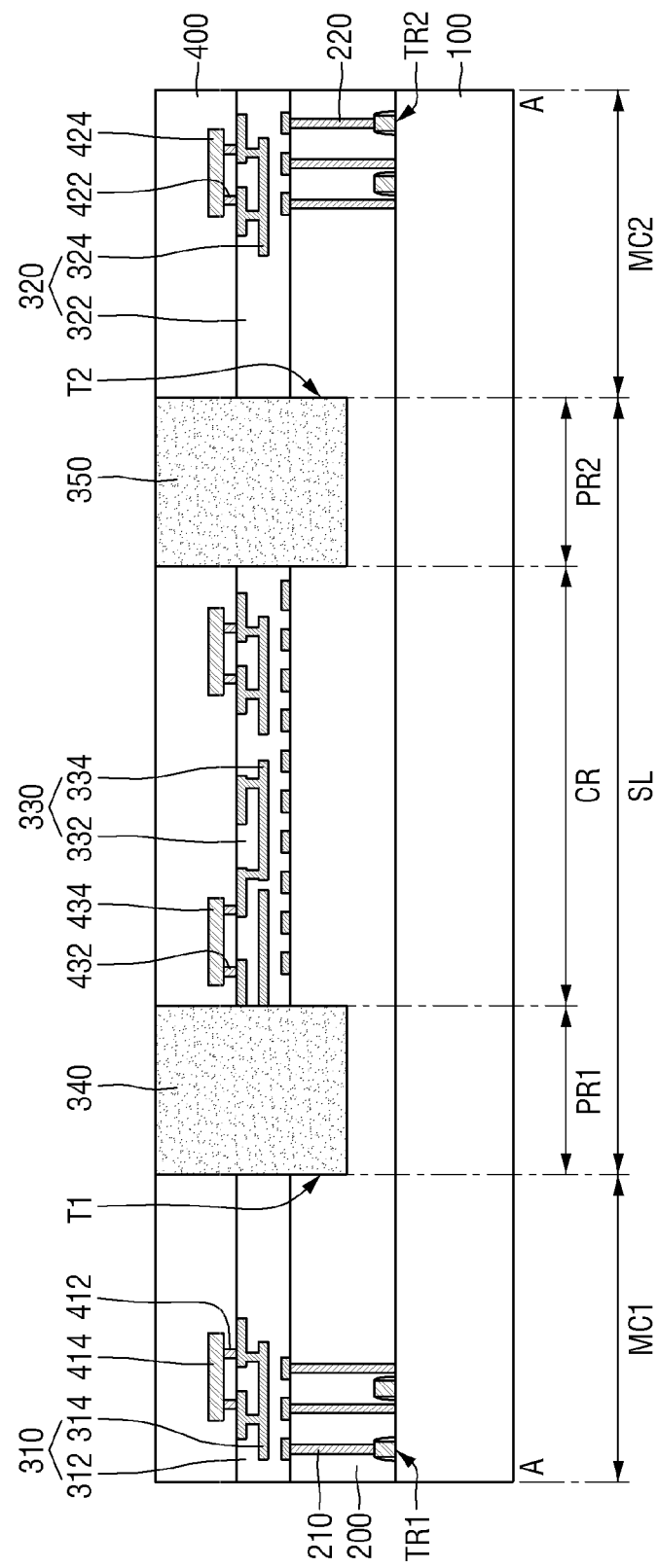

FIGS. 25 to 27 are intermediate step diagrams illustrating the method for fabricating a semiconductor device according to some embodiments of the present inventive concepts. For convenience of explanation, repeated parts of description provided with reference to FIGS. 1 to 21 will be briefly explained or omitted.

Referring to FIG. 25, a first interlayer insulating film 200, a wiring structure 300 and a second interlayer insulating film 400 are sequentially formed on the substrate 100.

The wiring structure 300 may include a low-k insulating film 302 and a wiring pattern 304.

The low-k insulating film 302 may include a first insulating material. In some embodiments, the first insulating material may be a low-k material having a dielectric constant lower than that of silicon oxide.

The wiring pattern 304 may be formed in the low-k insulating film 302. The wiring pattern 304 may include a conductive material.

In some embodiments, the first and second integrated circuit elements TR1 and TR2 may be further formed on the substrate 100 prior to forming the first interlayer insulating film 200. In some embodiments, the first lower via 210 and the second lower via 220 for connecting the first integrated circuit element TR1 and the second integrated circuit element TR2 to the wiring pattern 304 may be further formed in the first interlayer insulating film 200.

In some embodiments, a conductive film 404 may be further formed on the wiring structure 300. In some embodiments, an upper via 402 for connecting the conductive film 404 and the wiring pattern 304 may be further formed in the second interlayer insulating film 400.

In some embodiments, the first interlayer insulating film 200 and/or the second interlayer insulating film 400 may include silicon oxide. For example, the first interlayer insulating film 200 and the second interlayer insulating film 400 may include TEOS (TetraEthyl OrthoSilicate).

Although it is not illustrated, in some embodiments, a capping insulating film 410 may be further formed on the second interlayer insulating film 400. The capping insulating film 410 may include, but is not limited to, for example, silicon nitride and/or silicon oxynitride.

Referring to FIG. 26, the wiring structure 300 in the first protective region PR1 and the second protective region PR2 is removed.

For example, portions of the second interlayer insulating film 400, the conductive film 404, the upper via 402, the low-k insulating film 302 and the wiring pattern 304 in the first protective region PR1 may be removed, and the first trench T1 may be formed. Further, for example, portions of the second interlayer insulating film 400, the conductive film 404, the upper via 402, the low-k insulating film 302 and the wiring pattern 304 in the second protective region PR2 may be removed, and the second trench T2 may be formed.

As a result, the first wiring structure 310 in the first chip region MC1, the second wiring structure 320 in the second chip region MC2, and the third wiring structure 330 in the item region CR may be formed.

In some embodiments, the first trench T1 and the second trench T2 may be formed to expose a part of the top surface of the first interlayer insulating film 200. The bottom surfaces of the first trench T1 and the second trench T2 are illustrated as being lower than the bottom surfaces of the first to third low-k insulating films 312, 322 and 332 and higher than the top surface of the substrate 100, but the present disclosure is not limited thereto. For example, the bottom surfaces of one or more of the first trench T1 and the second trench T2 may be disposed on the same plane as or coplanar with the bottom surfaces of the first to third low-k insulating films 312, 322 and 332, or may be disposed on the same plane as or coplanar with the top surface of the substrate 100. In the present specification, the meaning of the term "same" includes not only completely the same thing but also a fine difference which may occur due to a process margin or the like.

Referring to FIG. 27, a first protective insulating film 340 is formed in the first trench T1, and a second protective insulating film 350 is formed in the second trench T2.

In some embodiments, the first protective insulating film 340 and the second protective insulating film 350 may include a second insulating material different from the first insulating material. In some embodiments, the second insulating material may include a silicon oxide having a dielectric constant higher than the first insulating material. For example, the first protective insulating film 340 and the second protective insulating film 350 may include TEOS (TetraEthyl OrthoSilicate).

In some embodiments, the first protective insulating film 340 and the second protective insulating film 350 may include the same material as the first interlayer insulating film 200 and the second interlayer insulating film 400. For example, the first protective insulating film 340, the second protective insulating film 350, the first interlayer insulating film 200 and the second interlayer insulating film 400 may include the same silicon oxide. For example, the first protective insulating film 340, the second protective insulating film 350, the first interlayer insulating film 200 and the second interlayer insulating film 400 may include TEOS (TetraEthyl OrthoSilicate).

Although each of the first and second protective insulating films 340 and 350 is illustrated as completely filling the first and second trenches T1 and T2, the present disclosure is not limited thereto. For example, the first protective insulating film 340 may fill only a part of the first trench T1, and the second protective insulating film 350 may fill only a part of the second trench T2. That is, as used herein, an element that fills a region may partially or completely fill the region. For example, in contrast to the illustrated configuration, the top surfaces of the first and second protective insulating films 340 and 350 may be disposed on the same plane as or coplanar with the top surfaces of the first to third low-k insulating films 312, 322 and 332.

That is, by forming the first and second protective insulating films 340 and 350 in the scribe lane region SL adjacent to the chip region MC, a fabricating method capable of fabricating a semiconductor device with improved reliability and/or productivity/production may be provided.

FIGS. 28 to 31 are intermediate step diagrams illustrating a method for fabricating a semiconductor device according to some embodiments of the present inventive concepts. For convenience of explanation, repeated parts of description provided with reference to FIGS. 1 to 27 will be briefly described or omitted.

Figure 28:
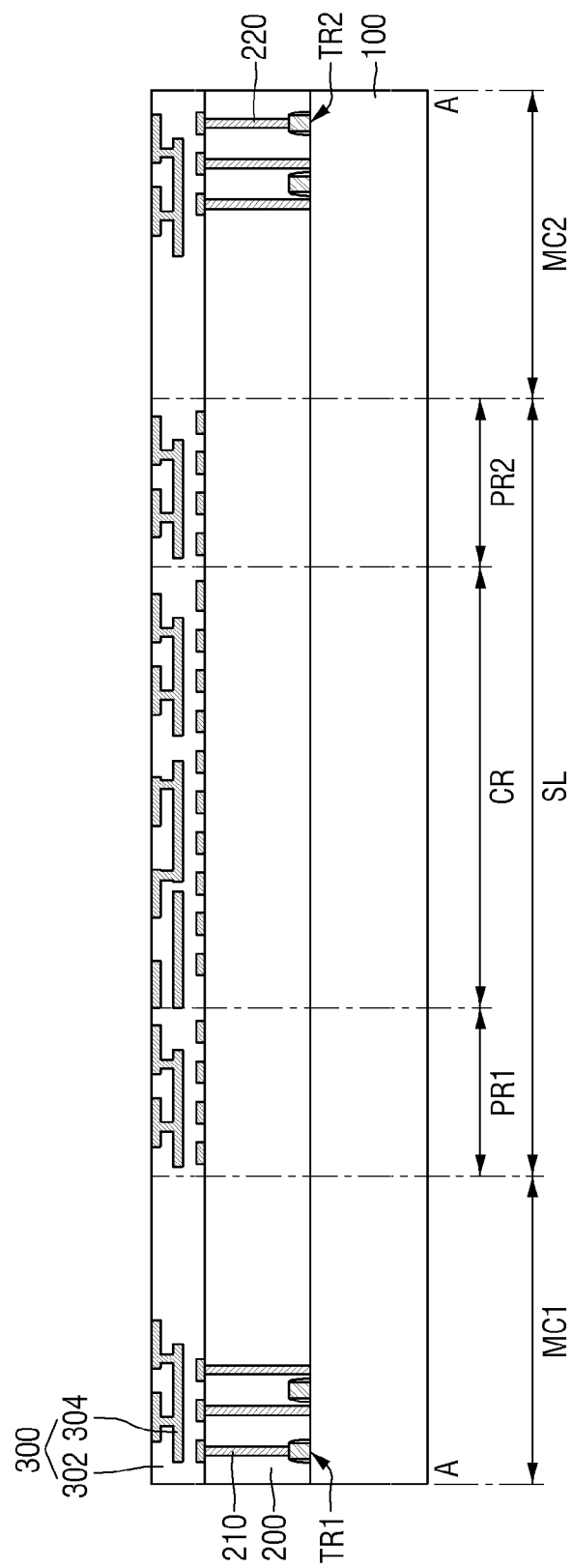
FIGS. 28 to 31 are intermediate step diagrams illustrating a method for fabricating a semiconductor device according to some embodiments of the present inventive concepts.

Referring to FIG. 28, a first interlayer insulating film 200 and a wiring structure 300 are formed sequentially on the substrate 100. Since formation of the first interlayer insulating film 200 and the wiring structure 300 is similar to that described with reference to FIG. 25, detailed description thereof will not be provided.

Figure 29:
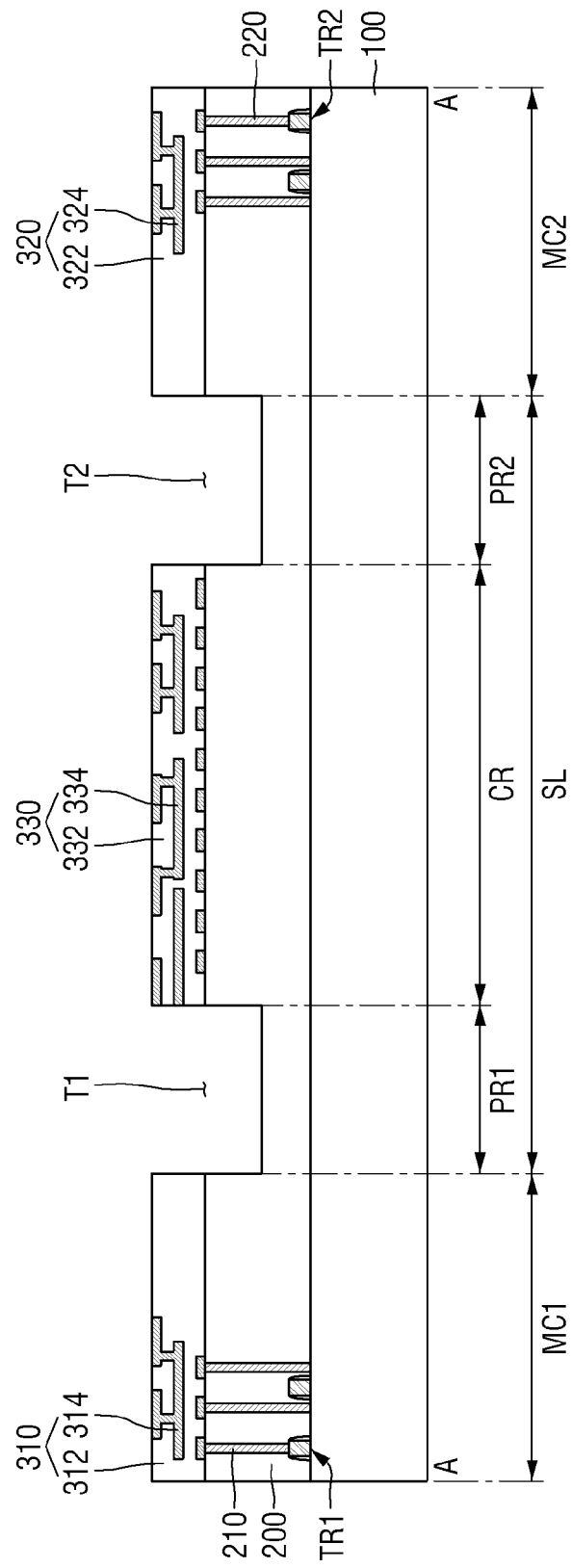

Referring to FIG. 29, the wiring structure 300 in the first protective region PR1 and the second protective region PR2 is removed.

For example, the first trench T1 may be formed by removing portions of the low-k insulating film 302 and the wiring pattern 304 in the first protective region PR1. Further, for example, the second trench T2 may be formed by removing portions of the low-k insulating film 302 and the wiring pattern 304 in the second protective region PR2.

As a result, the first wiring structure 310 in the first chip region MC1, the second wiring structure 320 in the second chip region MC2, and the third wiring structure 330 in the item region CR may be formed.

Figure 30:
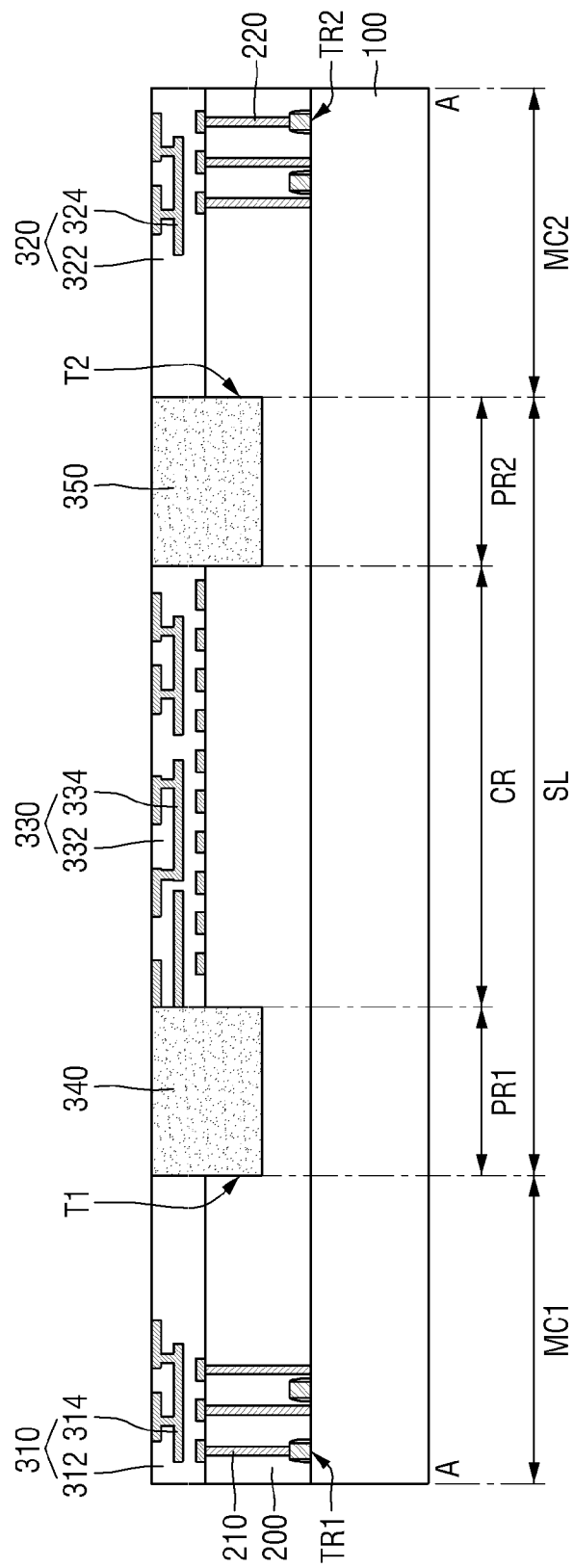

Referring to FIG. 30, the first protective insulating film 340 is formed in the first trench T1, and the second protective insulating film 350 is formed in the second trench T2.

In some embodiments, each of the first and second protective insulating films 340 and 350 may completely fill the first and second trenches T1 and T2. As a result, the top surfaces of the first and second protective insulating films 340 and 350 may be disposed on the same plane as or coplanar with the top surfaces of the first to third low-k insulating films 312, 322 and 332.

Figure 31:
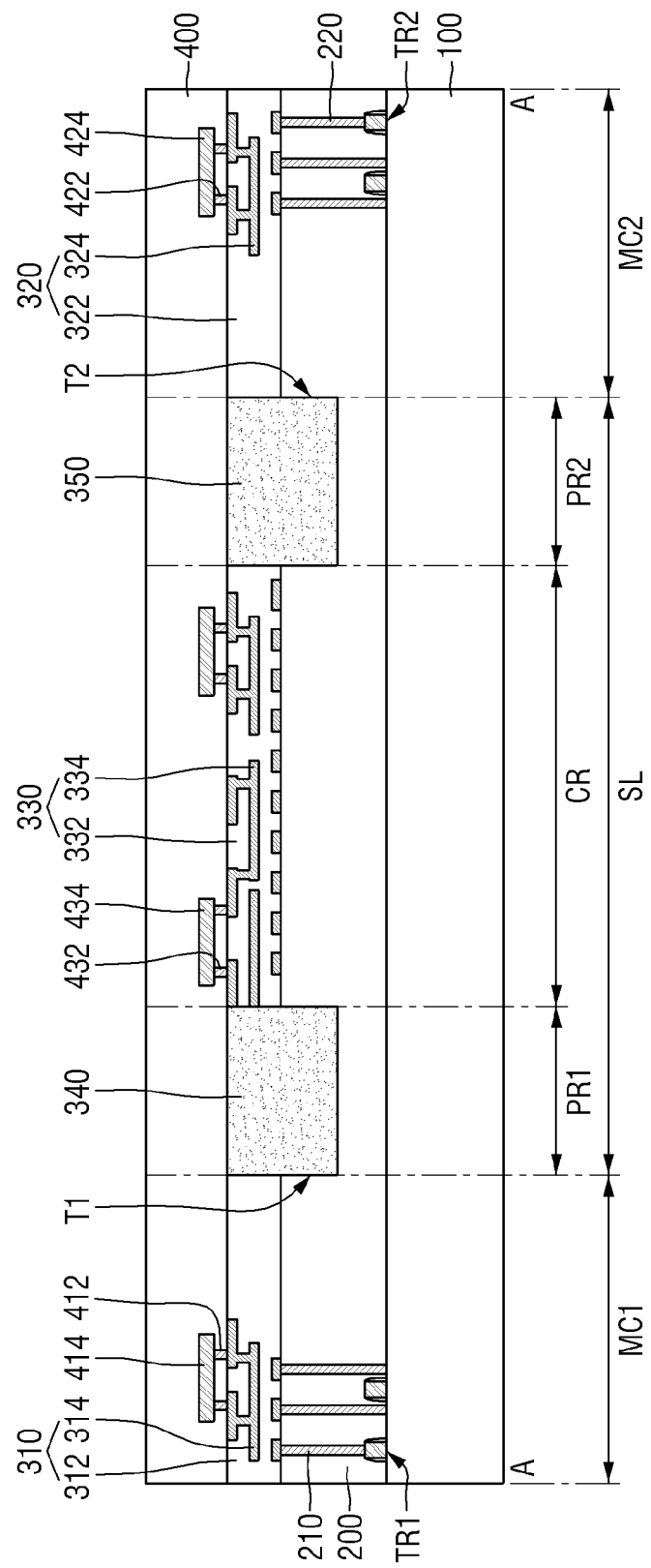

Referring to FIG. 31, a second interlayer insulating film 400 is formed on the first to third wiring structures 310, 320 and 330 and the first and second protective insulating films 340 and 350.

In some embodiments, the second interlayer insulating film 400 may include silicon oxide. For example, the second interlayer insulating film 400 may include TEOS (TetraEthyl OrthoSilicate).

In some embodiments, the second interlayer insulating film 400 may include the same material as the first protective insulating film 340 and the second protective insulating film 350. For example, the first protective insulating film 340, the second protective insulating film 350, and the second interlayer insulating film 400 may include the same silicon oxide. For example, the first protective insulating film 340, the second protective insulating film 350 and the second interlayer insulating film 400 may include TEOS (TetraEthyl OrthoSilicate).

In some embodiments, a conductive film 404 may be further formed in the second interlayer insulating film 400. In some embodiments, an upper via 402 for connecting the conductive film 404 and the wiring pattern 304 may be further formed in the second interlayer insulating film 400.

Those skilled in the art will appreciate that many variations and modifications may be made to the preferred embodiments without substantially departing from the principles of the present inventive concepts. Therefore, the disclosed preferred embodiments of the invention are used in a generic and descriptive sense only and not for purposes of limitation.

What is claimed is:

1. A method for fabricating a semiconductor device, the method comprising:
   providing a substrate comprising a chip region and a scribe lane region surrounding the chip region, the scribe lane region comprising an item region, and a protective region between the chip region and the item region;
   forming a first interlayer insulating film on the substrate, and a low-k insulating film on the first interlayer insulating film, the low-k insulating film comprising a first insulating material having a dielectric constant less than that of silicon oxide;
   forming a wiring structure in the low-k insulating film on the item region, the wiring structure including a first item pattern and a second item pattern that are electrically separated from each other;
   forming a trench in the low-k insulating film on the protective region, the trench exposing the first interlayer insulating film;
   forming a first protective insulating film in the trench, the first protective insulating film comprising a second insulating material different from the first insulating material; and
   forming a second protective insulating film between the first item pattern and the second item pattern, the second protective insulating film comprising the second insulating material.

2. The method of claim 1, wherein the first interlayer insulating film comprises the second insulating material.

3. The method of claim 2, wherein the second insulating material comprises silicon oxide.

4. The method of claim 1, further comprising:
   forming a second interlayer insulating film on the low-k insulating film, before forming the trench.

5. The method of claim 1, further comprising:
   forming a second interlayer insulating film on the low-k insulating film and the first protective insulating film, after forming the first protective insulating film in the trench, wherein the second interlayer insulating film comprises the second insulating material.

6. The method of claim 1, wherein the first interlayer insulating film and the first protective insulating film comprise TEOS (tetraethyl orthosilicate).

7. The method of claim 1, wherein the protective region surrounds the chip region, and wherein the item region surrounds the protective region.

8. The method of claim 1, wherein the first protective insulating film comprises a first partial protective insulating film and a second partial protective insulating film that are separated from each other.

9. The method of claim 8, wherein a part of the low-k insulating film is interposed between the first partial protective insulating film and the second partial protective insulating film.

10. The method of claim 8, further comprising:
    forming an insertion insulating film interposed between the first partial protective insulating film and the second partial protective insulating film,
    wherein the insertion insulating film comprises a low-k material having a dielectric constant lower than silicon oxide.

11. The method of claim 1, wherein the substrate further comprises a peripheral region between the chip region and the protective region, and
    the method further comprises forming a peripheral wiring structure in the low-k insulating film on the peripheral region.

12. The method of claim 11, wherein the peripheral wiring structure comprises a dam structure, a guard ring structure and crack detection circuit structure which are sequentially arranged in a direction from the protective region to the chip region.

13. The method of claim 1, further comprising:
    forming an integrated circuit element on the substrate in the chip region; and forming a first wiring pattern electrically connected to the integrated circuit element in the low-k insulating film.

14. The method of claim 1, wherein a dielectric constant of the second insulating material is greater than the dielectric constant of the first insulating material.

15. The method of claim 1, wherein the second insulating material comprises silicon oxide.

* * * * *